(12) United States Patent
Carothers et al.

(10) Patent No.: US 6,353,918 B1
(45) Date of Patent: Mar. 5, 2002

(54) INTERCONNECTION ROUTING SYSTEM

(75) Inventors: Jo Dale Carothers, Tucson, AZ (US); Donghui Li, Sunnyvale, CA (US)

(73) Assignee: The Arizona Board of Regents on behalf of The University of Arizona, Tucson, AZ (US)

( * ) Notice: Subject to any disclaimer, the term of this patent is extended or adjusted under 35 U.S.C. 154(b) by 0 days.

(21) Appl. No.: 09/142,793
(22) PCT Filed: Mar. 12, 1997
(86) PCT No.: PCT/US97/04116
  § 371 Date: Aug. 5, 1999
  § 102(e) Date: Aug. 5, 1999
(87) PCT Pub. No.: WO97/34316
  PCT Pub. Date: Sep. 18, 1997

Related U.S. Application Data
(60) Provisional application No. 60/013,481, filed on Mar. 15, 1996.

(51) Int. Cl.[7] .............................................. G06F 17/50
(52) U.S. Cl. .................. 716/8; 716/1; 716/12; 716/13
(58) Field of Search ........................... 716/1, 19, 6, 13, 716/8, 12

(56) References Cited

U.S. PATENT DOCUMENTS

| | | | |
|---|---|---|---|
| 4,577,276 A | 3/1986 | Dunlop et al. | 716/10 |
| 4,593,363 A | 6/1986 | Burstein | 716/10 |
| 4,613,941 A | 9/1986 | Smith et al. | 716/12 |
| 4,615,011 A | 9/1986 | Linsker | 716/13 |
| 4,713,773 A | 12/1987 | Cooper et al. | 716/15 |
| 4,752,887 A | 6/1988 | Kuwahara | 716/15 |
| 4,777,606 A | 10/1988 | Fournier | 716/12 |
| 5,272,645 A | 12/1993 | Kawakami et al. | 716/12 |
| 5,295,082 A | 3/1994 | Chang et al. | 716/12 |
| 5,375,069 A | 12/1994 | Satoh et al. | 716/14 |
| 5,475,611 A | 12/1995 | Nagase et al. | 716/13 |
| 5,519,632 A | 5/1996 | Chen et al. | 711/114 |
| 5,587,923 A | 12/1996 | Wang | 716/13 |
| 5,615,128 A * | 3/1997 | Scepanovic et al. | 716/13 |
| 5,784,292 A * | 7/1998 | Kumar | 716/19 |
| 5,880,967 A * | 3/1999 | Jyu et al. | 716/6 |
| 5,987,238 A * | 11/1999 | Chen | 716/1 |
| 6,083,271 A * | 7/2000 | Morgan | 716/1 |

* cited by examiner

Primary Examiner—Matthew Smith
Assistant Examiner—Jibreel Speight
(74) Attorney, Agent, or Firm—Snell & Wilmer L.L.P.

(57) ABSTRACT

The routing system implements a global approach (400) that proposes several candidate routes for various nets (402) and analyzes compatibility with respect to other routes and constraints (406), such as electrical or thermal considerations (404).

16 Claims, 28 Drawing Sheets

FIG. 7   $(X_s, Y_s)$ ——————— $(X_t, Y_t)$

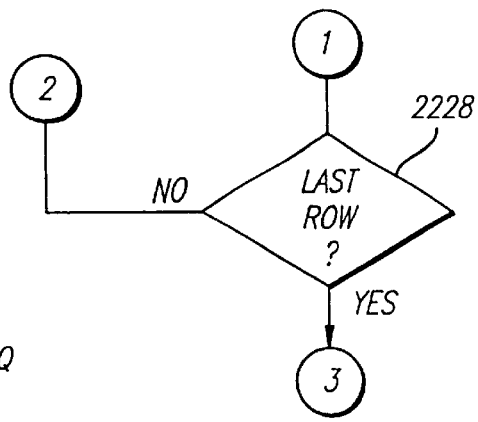
FIG. 22B
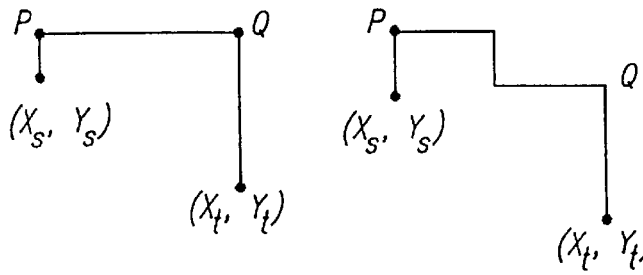
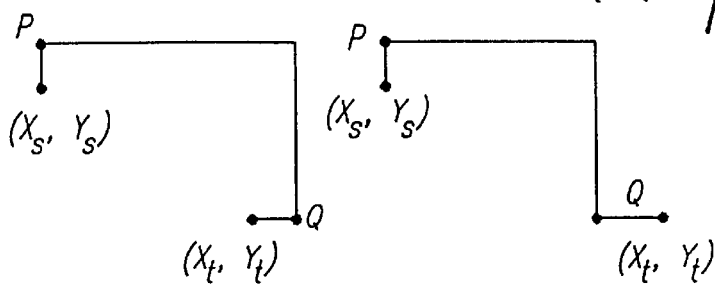
FIG. 23
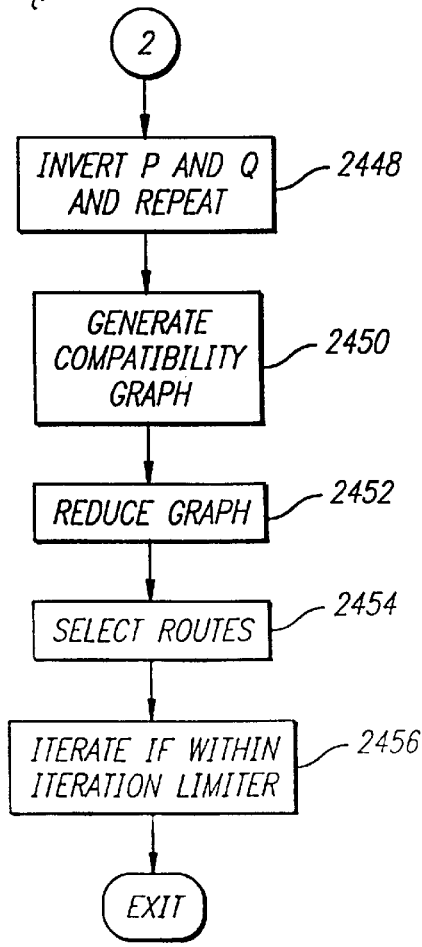
FIG. 24C

⊗ ESCAPE POINT
❖ OBSTACLES
● SOURCE OR TARGET

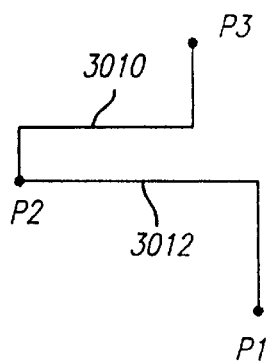
FIG. 30A
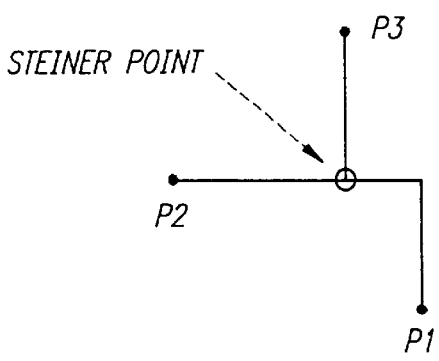
FIG. 30B
FIG. 31
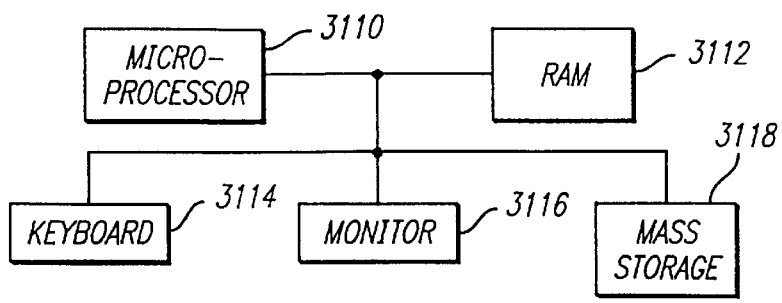
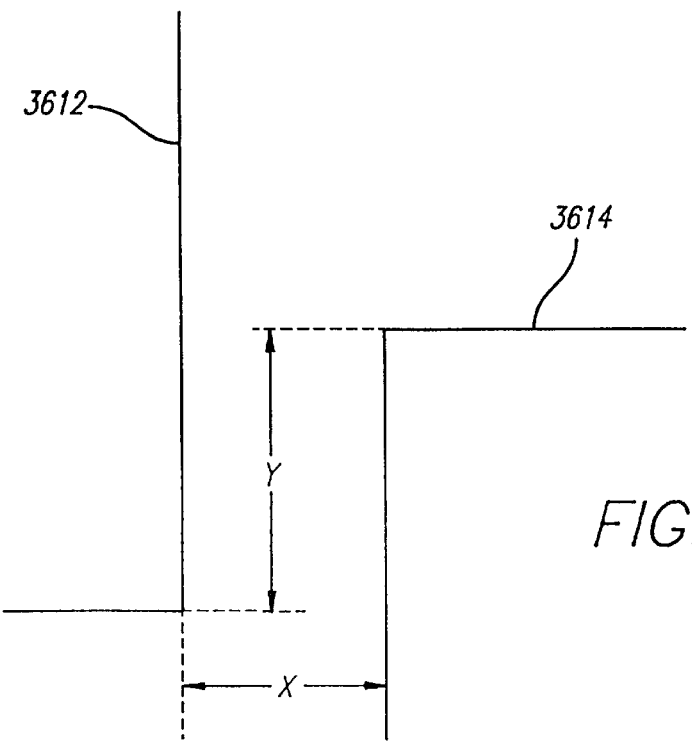
FIG. 36

INTERCONNECTION ROUTING SYSTEM

This Application claims benefit of Provisional Application Ser. No. 60/013,481 filed Mar. 15, 1996.

BACKGROUND OF THE INVENTION

1. Field of the Invention

The present invention generally relates to designing routes for interconnecting electrical components, and more particularly, to methods and apparatuses for routing interconnections between terminals of electrical components mounted on or fabricated in a substrate, board, or package.

2. Description of the Related Art

The technology of integrated circuits has progressed rapidly. Advances in the design and manufacture of integrated chips has increased the number of transistors on a chip from around 30 on early chips to the current very large scale integrated circuits having over 3 million transistors. Despite the advances in design and manufacturing techniques, however, the packaging and interconnection technologies have not progressed so quickly.

Conventional packaging involves enclosing bare dies of integrated chips in plastic or ceramic packages, which are then mounted on a printed circuit board (PCB). The packaged circuits are then interconnected on the PCB.

Although PCBs are effective for many applications, they provide limited density. In addition, relatively long wires interconnect the chips in PCBs, causing unacceptably long propagation delays for some high performance applications. To provide greater density and improved performance, many designers use multichip modules (MCMs) as an alternative packaging and interconnection system. MCMs bypass the single chip package by mounting bare dies directly onto a routing substrate. Eliminating chip packaging typically provides much denser assemblies as well as shorter and faster interconnects. In spite of the improved size, weight, speed, and power consumption MCMs offer over conventional PCBs, however, design obstacles, especially the physical design of the MCM, frequently engender high costs. In particular, the physical design of an MCM presents a technical, complex, and often costly process of laying out the components and interconnecting them, subject to various physical, thermal, and electrical constraints.

Although advances in the physical design of PCBs and integrated chips facilitated faster and better circuits and boards, the design tools used for PCBs and integrated circuits are often unsuitable for MCMs. MCM designs are typically too dense and complex for PCB design tools, and integrated circuit layout tools use different geometrical and electrical constraints. As a result, various researchers and industries have generated a variety of products and schemes dedicated to MCM design. The MCM physical design process presents a truly three dimensional challenge, as it includes multiple layers of interconnections beneath the top layer. Objectives in MCM design typically include minimizing the number of layers, minimizing the number of vias (vertical connections between layers through intervening insulative layers), minimizing total wire length, and satisfying electrical constraints such as timing considerations and crosstalk. Various types of design tools aim to achieve these objectives with varying degrees of success.

For example, maze routing is a well known technique, designed to seek a path between two points in a rectangular or box-like grid while avoiding obstacles. The implementation of maze-type systems, however, is limited to net-by-net routing, so that the order in which nets are routed may radically affect the resulting routing solution. Thus, establishing an appropriate net routing order is vital, though effective tools for doing so have yet to be developed. in addition, searching all of the available grid points for acceptable routes requires substantial processing time and considerable memory in the analyzing system, demanding sophisticated hardware. Further, maze routing tends to induce multiple vias because some nets are routed through several layers, and the net-by-net process limits the global optimization of the design. Several variations of maze routing tools have been developed, and substantially all of them suffer these shortcomings to some degree.

Some systems avoid net ordering, improving the performance of the design tool. Nonetheless, such design tools cannot easily incorporate electrical constraints and the like into the design. In addition, further improvements in density, via minimization, and wire length reduction are desirable. In sum, it would be advantageous to develop a routing system without net ordering problems incorporate other considerations, such as electrical constraints, into the design, and maintain high density routing solutions.

SUMMARY OF THE INVENTION

A routing system according to various aspects of the present invention comprises a computer system for generating candidate routes and analyzing them for compatibility. The routing system employs a global approach to generate several candidate routes before analyzing them for compatibility. Incompatible routes are then selectively deleted from the configuration to arrive at a fully compatible set of routes. The process reiterates to generate further compatible routes using different candidate routes and routes of different complexity. Ultimately, the process arrives at a fully compatible set of routes, or adds further layers as may be necessary to accommodate all of the nets. The process is then repeated for the new layer pair until all of the nets are routed. A post-routing procedure may also be implemented to further simplify the routing solution.

A routing system according to various aspects of the present invention initially generates routes without regard to potential conflicts with other candidates, thus avoiding net ordering problems. In addition, the designer is allowed to select the topology of the routes. Further, electrical considerations, such as crosstalk potential or timing constraints, may be incorporated into the analysis and routing system. The present routing system provides enhanced routing solutions by minimizing the number of layers, vias, and wire length, and improving overall density.

BRIEF DESCRIPTION OF THE DRAWING

The subject matter of the invention is particularly pointed out and distinctly claimed in the concluding portion of the specification. The invention, however, both as to organization and method of operation, may best be understood by reference to the following description taken in conjunction with the claims and the accompanying drawing, in which:

FIG. 4A is a diagram of a layout for identifying node and obstacle locations;

FIG. 7 is a diagram of a type 0 route;

FIGS. 22A–B are flow diagrams of a process for generating type 5 routes in accordance with the process of FIG. 16;

FIG. 23 is a diagram of four potential type X routes for selected source and target nodes;

FIGS. 24A–C are a flow diagram of a process for generating type X routes;

FIGS. 30A–B are diagrams of a route before and after insertion of Steiner points;

FIG. 31 is a diagram of a computer system suitable for implementing a routing process in accordance with various aspects of the present invention;

FIG. 36 is a diagram of a pair of overlapping, parallel route segments separated by a distance.

DETAILED DESCRIPTION OF EXEMPLARY EMBODIMENTS

General MCM Structure

Figure 1:
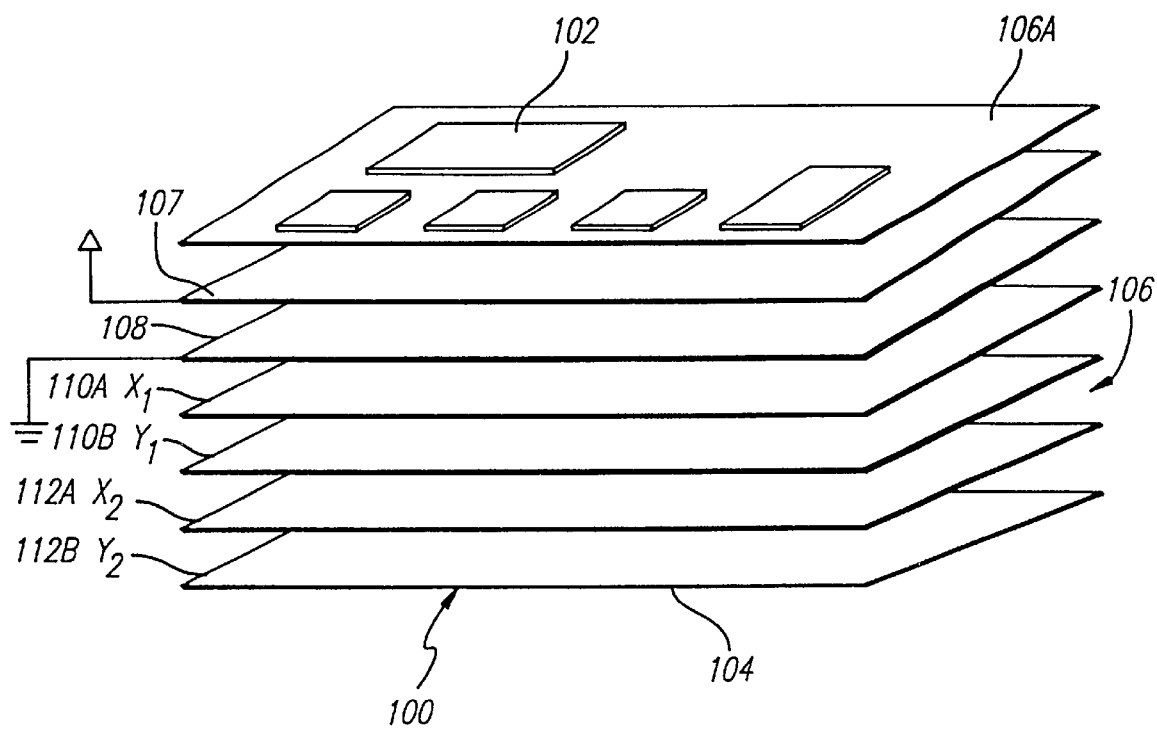
FIG. 1 is an exploded view of a multi-chip module.

Referring now to FIG. 1, an electrical circuit, suitably an MCM 100. comprises a plurality of circuits 102 disposed on a multi-layer substrate 104. Circuits 102 suitably comprise any electrical components, such as unpackaged integrated circuit dies for MCM 100, packaged integrated circuit chips for a PCB, or subcircuits within an integrated circuit. Circuits 102 are suitably disposed about the surface and mounted on multi-layer substrate 104 using a suitable mounting method and mechanism. Circuits 102 are interconnected by conductors dispersed through multi-layer substrate 104.

Multi-layer substrate 104 suitably comprises alternating layers 106 of a conductive material, such as copper, separated by layers of insulative material (not shown). Each conductive layer 106 may be connected to others layers 106 and circuits 102 by vertically disposed vias formed through the insulator layers. For example, multi-layer substrate 104 suitably comprises at least one power layer 107, at least one ground layer 108, and a plurality of routing layers. Power layer 106 is suitably connected to a power source to transfer power to the various layers and circuits 102. Similarly, grounding layer 108 is suitably connected to ground or some other reference voltage. Power layers 107 and ground layers 108 may be further disposed between the various other layers and layer pairs. Routing layers 110A–B and 112A–B suitably comprise strips of conductive material, or wires configured to connect to various vias to provide interconnections among the various circuits 102. In addition, multi-layer substrate 104 suitably includes at least one distribution layer (not shown) for advantageously positioning terminals of circuits 102 with respect to routing layers 110A–B, 112A–B and circuits 102.

General Routing Process Overview

Figure 2:
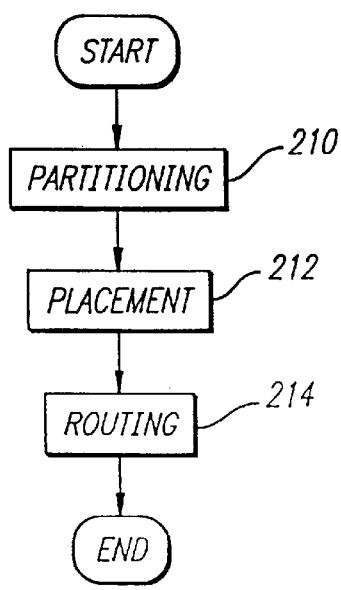
FIG. 2 is a flow diagram of a process for the physical design of an MCM.

Referring now to FIG. 2, MCM 100 is suitably designed according to a process comprising the steps of: partitioning an overall electrical system into a series of circuits 102 (step 210); placing the circuits 102 at suitable locations on the top layer 106A of multi-layer substrate 104 (step 212): and routing the interconnections between the various circuits 102 among the layers 106 (step 214). The partitioning step 210 comprises separating the desired overall electrical system into individual circuits 102, suitably so that each of the circuits 102 can be fabricated as a single unit. In addition, the number of subcircuits is suitably less than or equal to the number of circuits 102 that fit on multi-layer substrate 104.

After partitioning, placement step 212 maps the various circuits 102 to particular sites on multi-layer substrate 104. Placement step 212 further suitably connects the terminals of circuits 102 to selected locations on the distribution layer. Placement step 212 suitably produces a net list, which describes the desired interconnections among the various terminals of circuits 102. For example, the net list may include a list of desired interconnections, or nets, between terminals of the circuits, for example by listing identifiers of the source node and target node for each net. Although the net list is suitably determined in conjunction with the placement step 212 in the present embodiment, the net list may be generated prior to placement or at any other appropriate time using any suitable technique or mechanism.

Routing step 214 according to various aspects of the present invention provides a suitable routing solution for selecting interconnection routes for the various nets. As described in greater detail below. a routing process and apparatus according to the present invention generates multiple candidate routes for each net on the net list. The candidate routes are then suitably analyzed for compatibility, and the list of candidate routes is reduced to arrive at a fully compatible set. The routing system determines compatibility according to any suitable geometrical and electrical design considerations specified by the designer, such as crosstalk and manufacturing constraints for the various nets. If necessary, layer pairs may be added to accommodate routes which cannot be incorporated into previous layers. The process is suitably reiterated until all of the nets are compatibly routed.

Routing System

Referring now to FIG. 31, a suitable routing system 10 includes a microprocessor 3110 for executing instructions; a high speed memory, such as random access memory (RAM) 3112 for storing programs and data; a data entry interface, such as a keyboard 3114, for entering data and instructions by a designer; a data display interface, such as a monitor 3116, for providing information to the designer, and a mass storage system 3118, such as a hard disk array, for storing large quantities of data and programs. Microprocessor 310 may be associated with a computer system such as a Sun Microsystems Sparc-10 workstation, that uses any suitable language and operating system, such as the C++ language. The various instructions for implementing the present routing process are suitably stored in mass storage system 3118 until executed, at which time the instructions are copied, in whole or in part, into RAM 3112 for execution by microprocessor 3110. Similarly, data relevant to execution of the process, such as net lists and design constraints, may be entered by the designer through keyboard 3114 and stored in mass storage 3118. Alternatively, such data may be generated in any suitable manner, for example, by a dedicated program, or in conjunction with a program performing the placement step. Information generated by the microprocessor while executing the instructions is suitably displayed on monitor 3116, and is also suitably stored in mass storage system 3118.

Main Steps for Routing

Figure 3:
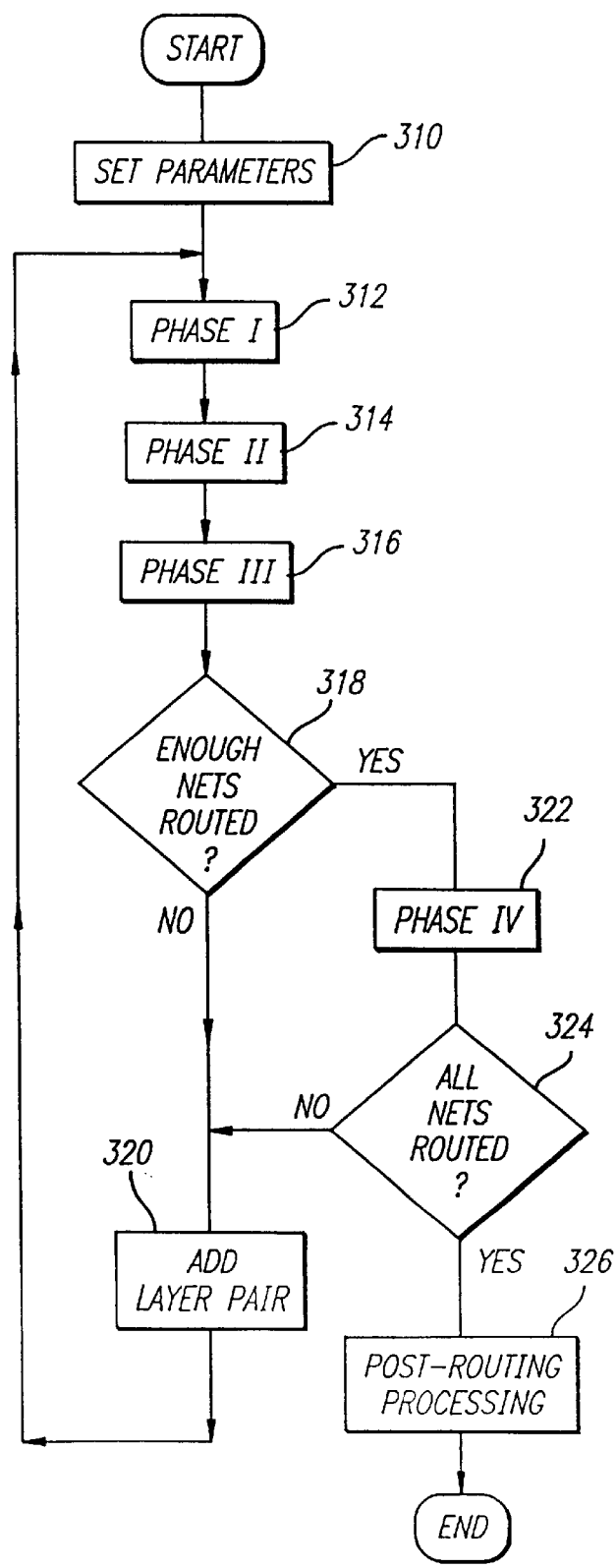
FIG. 3 is flow diagram of the routing process of FIG. 2.

Referring now to FIG. 3, routing system 10 according to various aspects of the present invention executes a sequence of steps for arriving at a routing solution. To generate the routing solution, various parameters are set by the designer (step 310) to guide the routing and compatibility analysis, such as by creating a net list. Based on the entered parameters, routing system 10 generates a set of candidate routes for compatibility analysis, suitably in three phases (steps 312, 314, 316). In the present embodiment, each phase may generate routes of increasing complexity. The number of phases and the operations performed by those phases, however, may be adjusted according to the desired results, the available computing resources, the complexity of the design, and other relevant factors. If more layers are required to complete the routing process (step 318), additional layers, preferably a pair of layers, may be added and a new set of candidate routes for the remaining unrouted nets may be generated (step 320). If less than a selected number of nets remain to be plotted, however, a fourth phase (step 322) attempts to generate a set of routes to incorporate the remaining nets into the current set of layers. If the attempt is unsuccessful, further layers are suitably added and the process repeats (step 324). If the fourth phase succeeds, however, all of the nets have been compatibly routed. Routing system 10 then performs a post-routing procedure (step 326) to optimize various features of the physical design.

Initial Steps

To generate the candidate routes, the designer suitably provides routing system 10 with a set of parameters, for example by storing a net list in mass storage 3118 or RAM 3112, to guide the routing of the nets. For example, the net list suitably comprises a set of values indicating which terminals of circuits 102 are to be interconnected and may include details regarding any electrical or other characteristics which may affect the compatibility of a route with other routes. In addition, any further parameters relating to either individual nets or the overall system may be entered as parameters.

Figure 4:
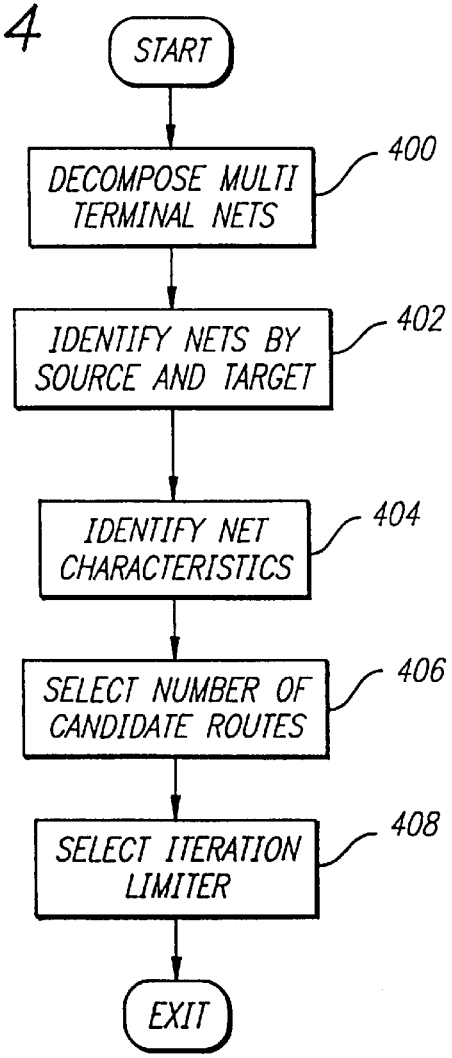
FIG. 4 is a flow diagram of a process for setting parameters in accordance with the process of FIG. 3.

For example, referring now to FIG. 4, a suitable process for setting the parameters for the routing process comprises initially decomposing multi-terminal nets on the net list (step 400. Multi-terminal nets comprise nets having more than two terminals. Multi-terminal nets may be treated according to special rules, such as that one branch of a multi-terminal net does not present an obstacle to any other branch of the same net. Decomposing multi-terminal nets suitably comprises listing the net as two or more two-terminal nets as may be required to describe the entire multi-terminal net. In particular, multi-terminal nets may be decomposed using a conventional minimal spanning tree approach. For critical nets, a minimum-length Steiner tree algorithm may be implemented for optimal results. The processing requirements of such algorithms, however, may limit the usefulness of such complex algorithms. In addition, it should be noted that the step of decomposing multi-terminal nets may be omitted if other provisions exist to route multi-terminal nets. For example, candidate route generation algorithms that are configured to generate candidate routes for multi-terminal nets may not require the step of decomposing the multi-terminal nets.

Setting parameters also suitably includes identifying each of the various nets, including decomposed multi-terminal nets, by providing the source and target of each net to the net list (step 402). Referring to FIG. 4A, source and target nodes are suitably described according to a coordinate system based on a grid. Although the present embodiment includes a grid, gridded or gridless routing may be implemented in accordance with the present invention. It should be noted that any sort of topology using angles, non-linear connections, or any other connection scheme may be used. The orientation of the grid is arbitrary, and suitably comprises rows defined along an X axis and columns defined along a perpendicular Y axis. As shown in FIG. 4A, the designation of the rows suitably increases as the rows proceed downward along the X axis. Similarly, the designation of the columns increases as the columns proceed rightward along the Y axis. For the purposes of this application, the location of a node is determined according to the X and Y coordinates, such that the source node's location is designated as $(X_s, Y_s)$ and the target node's location is $(X_t, Y_t)$. Further, the furthest grid point away from a node short of an obstacle is similarly designated, such as the designation $(X_s, Y_{s\_right})$ for the furthest grid point to the right of the source, or $(X_{t\_up}, Y_t)$ for the furthest grid point above the target.

In addition, for the purposes of convenience in this application, all nets are presumed to include a target node to the right and below the source. For convenience, the source may be simply designated as the upper node on the grid, and when the target is to the left of the source, the principles of the present invention may be reoriented to accommodate the target's relative position.

Various net characteristics may also be associated with each net in the net list (step 404). For example, various electrical and geometric constraints may be provided relating to, for example, wire width, minimum pitch, and the like. Next, a preferred number of candidate routes is set (step 406). The number of candidate routes indicates how many candidates the system establishes for each net in the net list. Depending on the complexity of the routing requirements and the processing capability of the system, the number of candidate routes is suitably set between 1 and 50 for less complex routing requirements, between 1 and 20 for most applications, and preferably between 2 and 10, candidate routes per net. Finally, an iteration limiter may be identified to control the number of repetitions through which the process cycles. For example, the iteration limiter suitably comprises a number of times through which the process will run. Alternatively, the iteration limiter may comprise a percentage, such as 0.1% to 1.5%, of the total number of nets remaining which must be routed with each iteration to continue the iterative process. In the event that less than this number of routes is plotted, the iterative process ceases.

Figure 11:
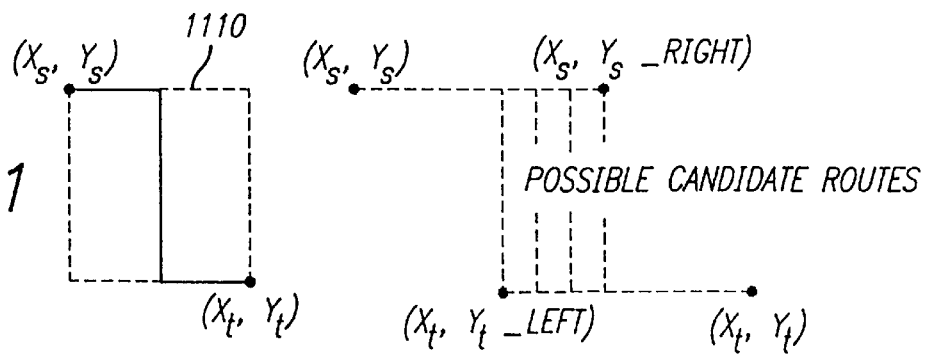
FIG. 11 is a diagram of a type 2 route and an illustration of possible candidate routes.

Referring again to FIG. 3, a routing system 10 suitably uses the parameters provided by the designer to generate candidate routes. In the preferred embodiment of the present invention, candidate routes are oriented only parallel to the X and Y axes. Thus, distances between the nodes in the present embodiment are configured as Manhattan distances. In alternative embodiments, however, routes may be created along diagonals and the like by changing the routing parameters. Initially, to minimize wire lengths for candidate routes, all candidate routes are confined, as shown in FIG. 11, to the particular net's bounding box 1110, defined by the rectangle formed by the source and target nodes on the grid. In the present embodiment, routes having the minimum distance between nodes are confined to various routes within the bounding box.

Phase I: Simple Routing

Defining routes within the bounding box for a pair of nodes on the net list is suitably divided into two phases. Phase 1 suitably includes steps for generating relatively simple routes, preferably having no more than two vias per route. Phase 2, on the other hand, generates more complex routes, having any number of vias, preferably between three and five per net. Routes of any complexity and number of vias may be generated according to the present invention, though in the preferred embodiment routing system 10 generates routes within the bounding box having no more than four or five vias to minimize processing and time requirements of the system.

Figure 5:
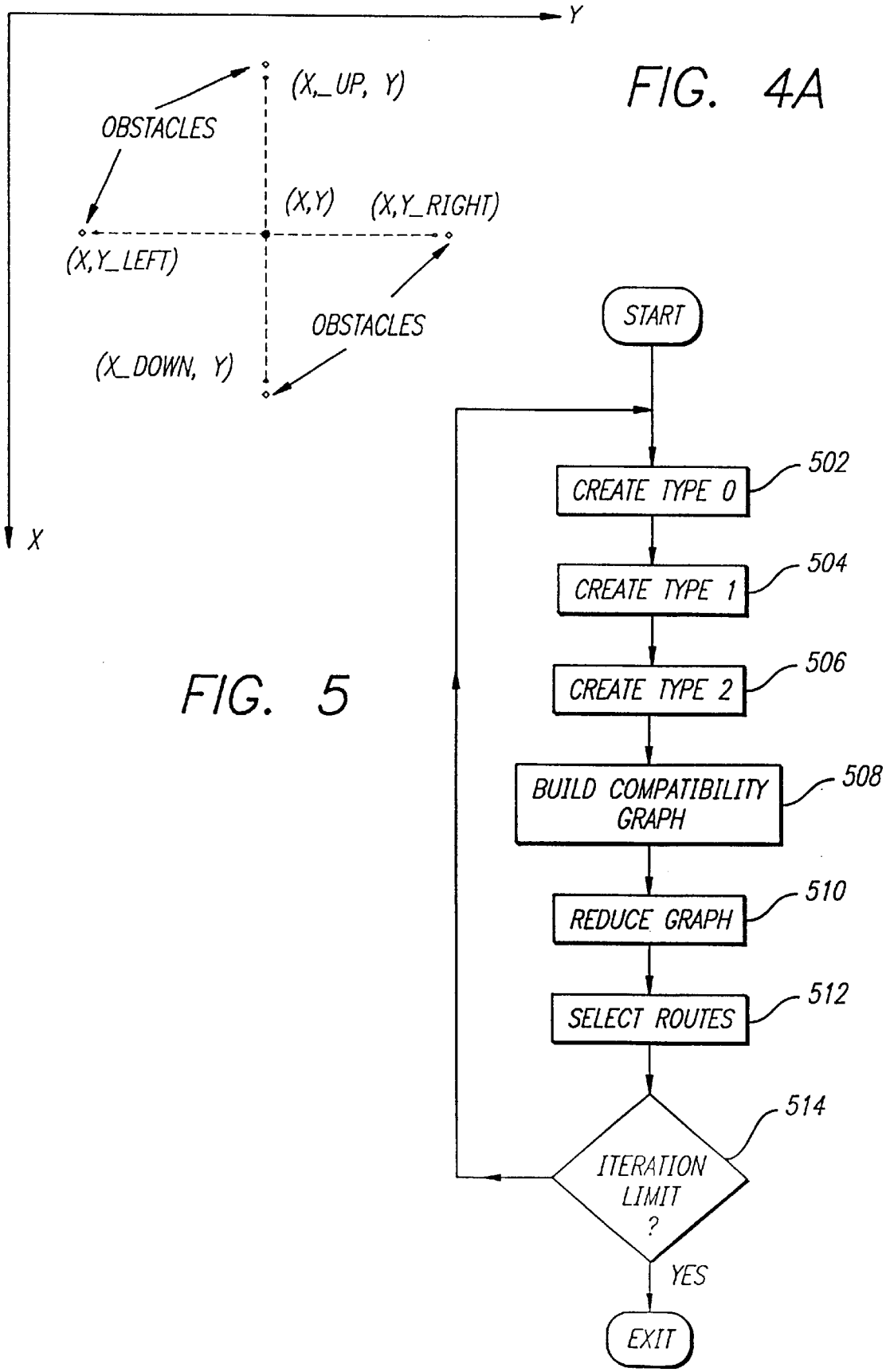
FIG. 5 is a flow diagram of a first phase of generating candidate routes in accordance with the process of FIG. 3.

Referring now to FIG. 5, the first phase 312 of the routing process suitably comprises generating three simple types of candidate routes within the bounding box for each unplotted net. Candidate routes are generated for each unplotted net, unless no further candidate routes are possible for a particular net. After the first three types of candidate routes have been generated, routing system 10 generates a compatibility graph illustrative of which candidate routes are incompatible with other candidate routes, and reduces the graph to arrive at a completely compatible set of routes. These routes are selected for each net, and each such net is designated as plotted. The process then repeats until the limit specified by the iteration parameter is fulfilled.

Type 0 Routes

Figure 6:
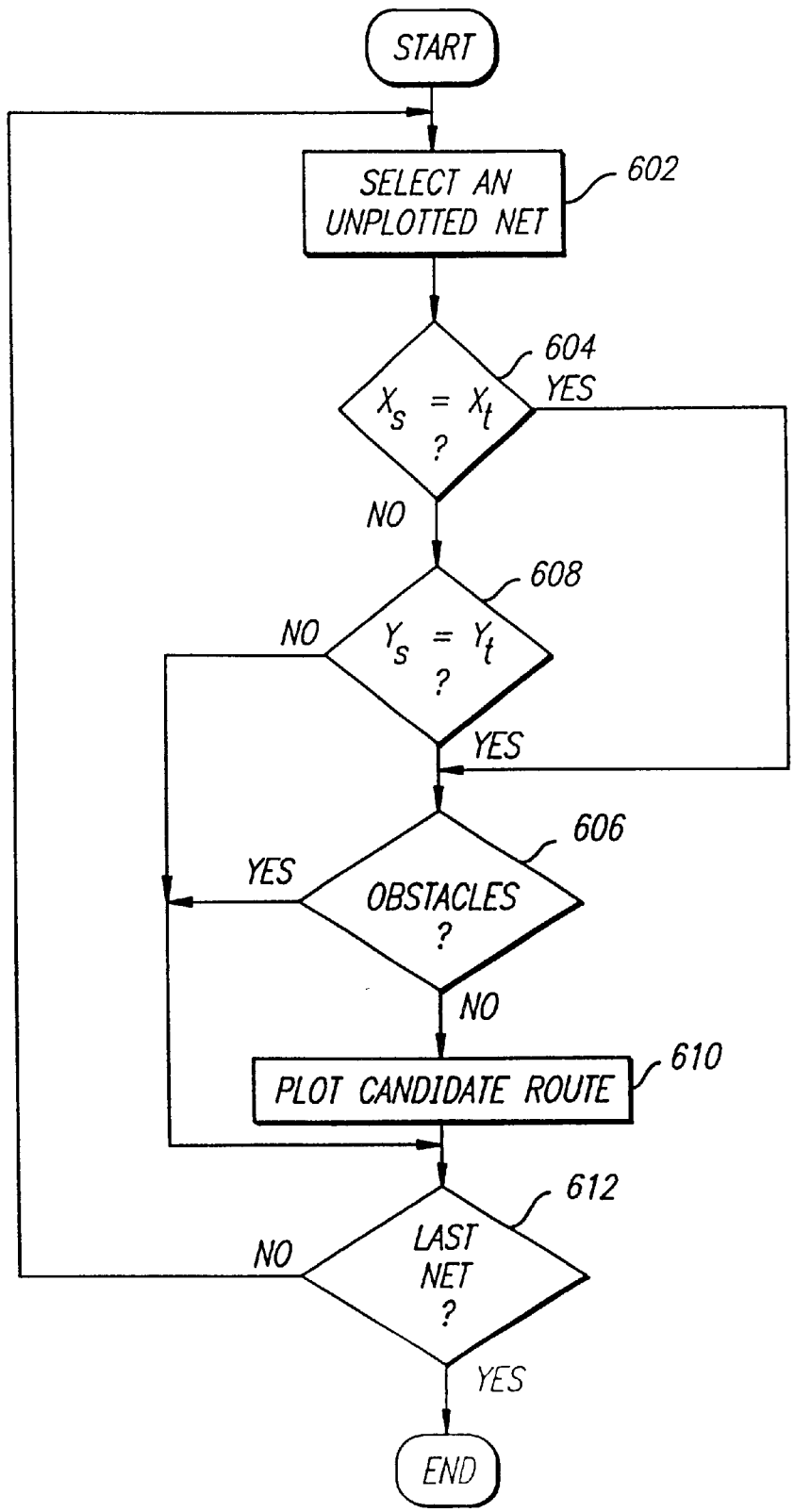
FIG. 6 is a flow diagram of a process for generating type 0 routes in accordance with the process of FIG. 5.

More particularly, routing system 10 generates candidate routes having zero, one, and two vias, designated as type 0, type 1, and type 2 routes, respectively. Referring now to FIGS. 5 and 6, routing system 10 initially generates a type 0 candidate route, if possible (step 502). A type 0 route, illustrated in FIG. 7, includes no vias, comprising a straight connection between the nodes. Because a type 0 net has no vias, the source and target nodes for the net are in the same column or row. Thus, each net has only one potential type 0 candidate route.

To generate type 0 candidate routes, routing system 10 suitably selects an unplotted net for routing (step 602). If the source and target nodes are on the same row (step 604), the system checks for obstacles between the nodes (step 606). Similarly, if the source and target nodes are in the same column, the system also checks for obstacles (step 608). If no obstacles are identified between the nodes, the system plots a candidate route (step 610). If obstacles are present, or if the source and target nodes are not aligned on the same row or column, the net is not a suitable for a type 0 candidate route, and the system proceeds to check another net (step 612). If all of the unplotted nets have been checked, the type 0 cycle is completed and exits.

Type 1 Routes

Figure 8:
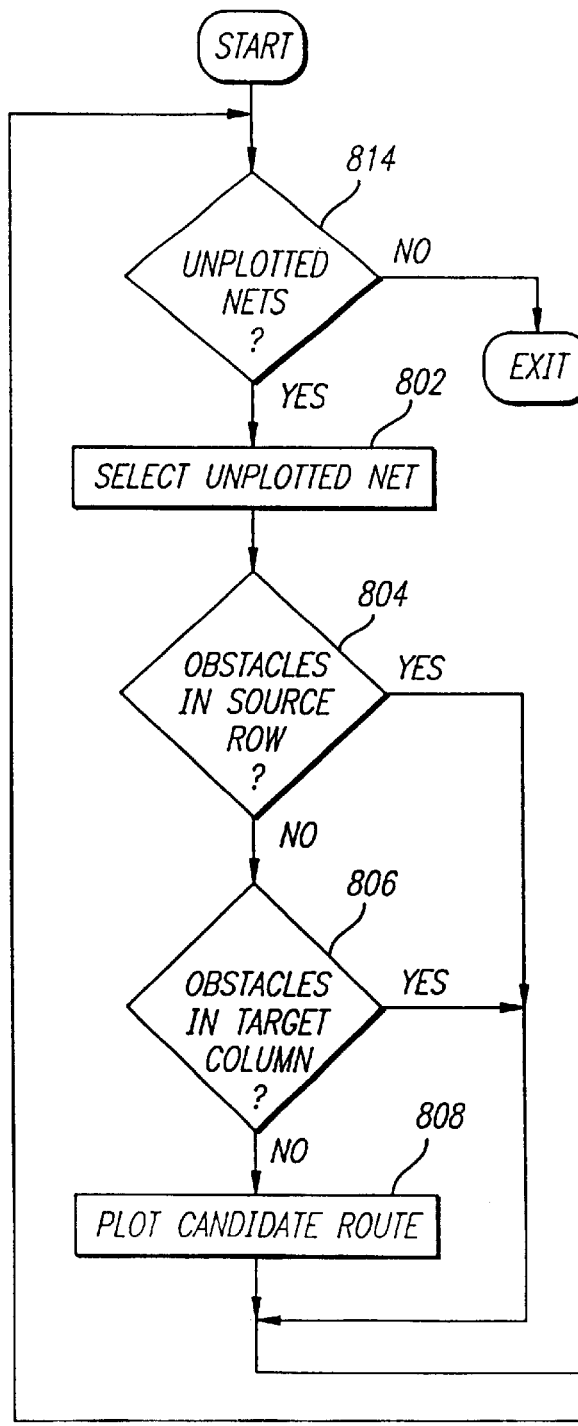
FIG. 8 is a flow diagram of a process for generating type 1 routes in accordance with the process of FIG. 5.
Figure 9:
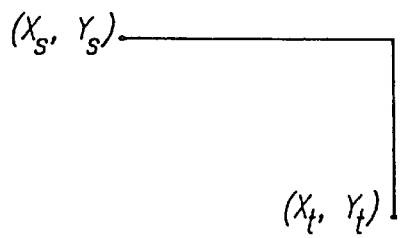
FIG. 9 is a diagram of a type 1 route.

After all of the nets have been analyzed for type 0 routing, routing system 10 suitably generates type 1 candidates for the unplotted nets (step 504, FIG. 5). Type 1 routes have only one via, as shown in FIG. 9. Thus, routing system 10 may identify only two type 1 routes for each net. Referring now to FIGS. 8 and 9, routing system initially selects an unplotted net (step 802). Next. routings system identifies any obstacles between the source node and the column of the target node (step 804), and between the source row and the target node (step 806). Any such obstacles interrupt the route, so routing system 10 proceeds to the next potential route. If no such obstacles are identified, however, a candidate route is plotted along the source row and the target column (step 808).

The other potential type 1 route is also suitably checked for obstacles. For example, any obstacles between the source node and the target row and between the source column and the target node are identified (steps 810 and 812). If no obstacles are identified, routing system plots the candidate route (step 816). Any obstacle in either of the checked paths causes routing system 10 to proceed to the next net, if one is available (step 814). If another net is available for plotting, the routing system begins the type 1 route plotting process again; otherwise, the type 1 plotting process terminates (step 814).

Type 2 Routes

Figure 10A:
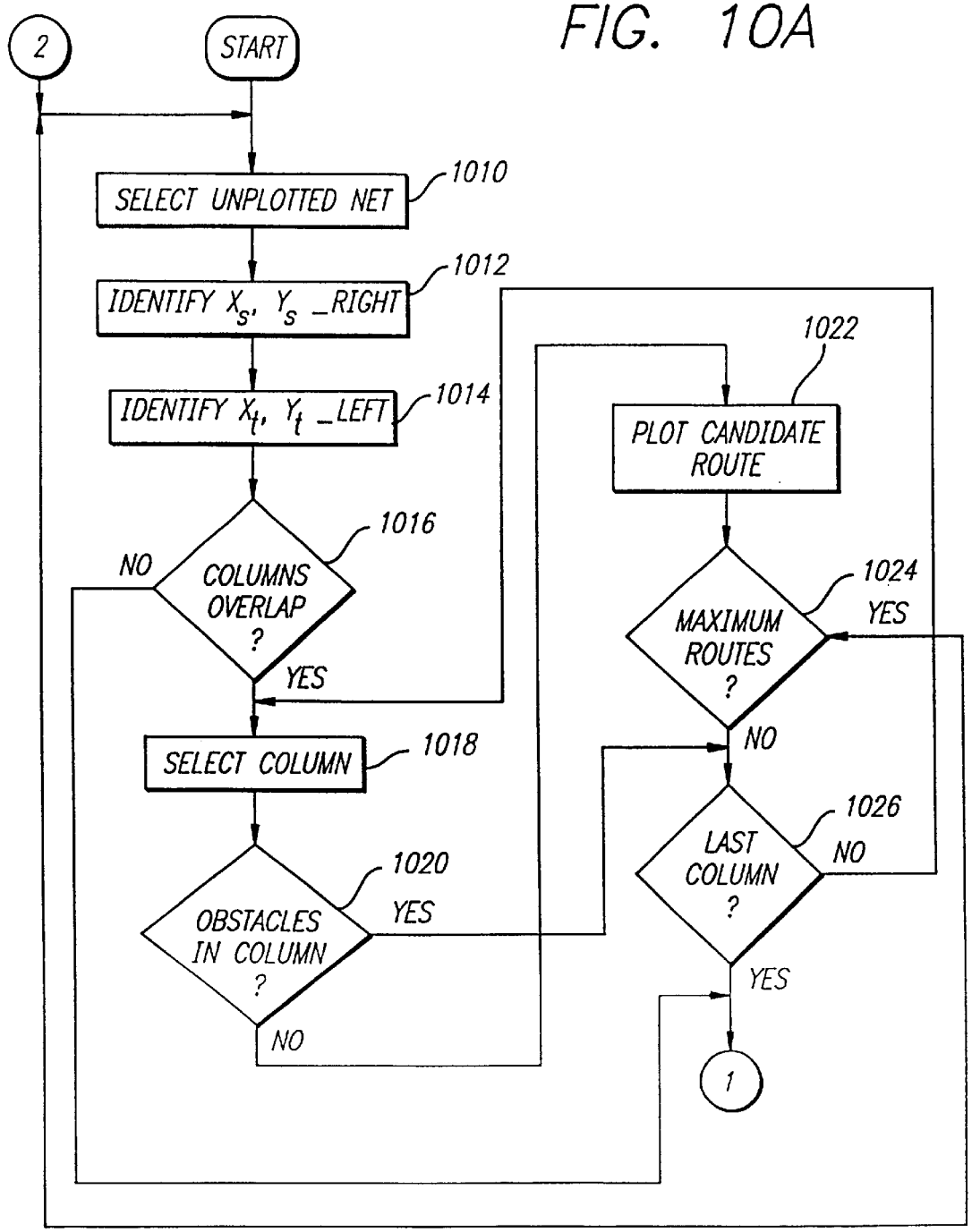
FIGS. 10A–B are flow diagrams of a process for generating type 2 routes in accordance with the process of FIG. 5.
Figure 10B:
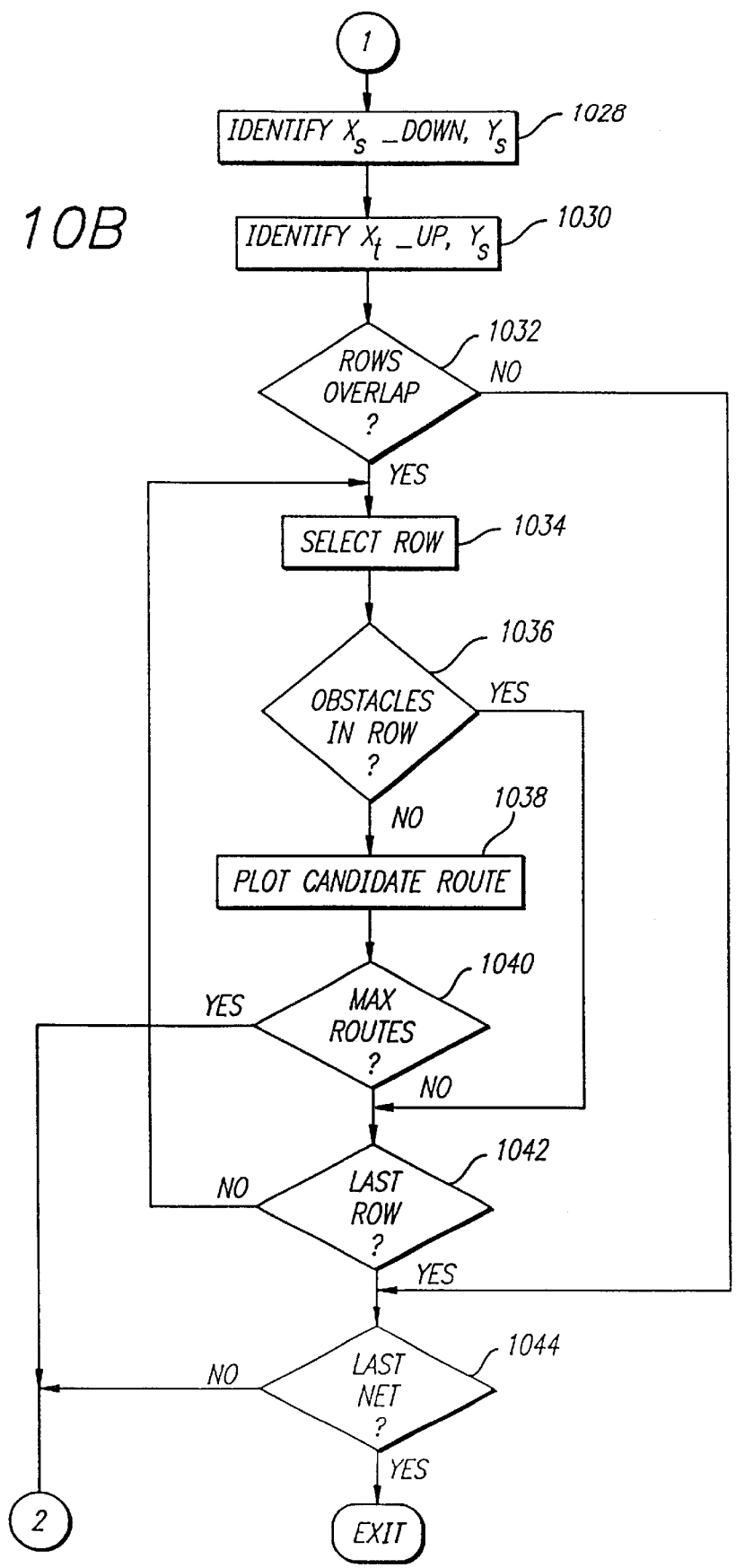

When all of the nets have been processed by the type 1 procedure, routing system 10 proceeds to generate type 2 candidate routes (step 506, FIG. 5). Referring now to FIGS. 10A–B and 11, type 2 routes include two vias, and may be plotted along an intervening column or row between the source and target nodes. To generate type 2 routes, routing system 10 may initially select an unplotted net (step 1010) and identify the first obstacle between the source node and the target column (i.e., $X_s$, $Y_{s\_right}$) (step 1012), and the first obstacle between the target node and the source column (i.e., $X_t$, $Y_{t\_left}$) (step 1014). If the columns do not overlap, routing system 10 proceeds to analyze the intervening rows (step 1016).

If the columns between the nodes and the obstacles overlap (i.e., $Y_{s\_right} >= Y_{t\_left}$), then one of the columns is selected for further analysis (step 1018). The selected column is checked for obstacles between the source and target rows (step 1020). If none are identified, a candidate route is plotted (step 1022). If the new route fulfills the maximum routes parameter (step 1024), a new net is selected for analysis. If further routes are to be plotted, routing system determines whether any further columns are available for analysis (step 1026). If so, a new column is selected and analyzed.

If the analysis of the columns is complete, routing system 10 suitably performs a similar analysis based on the intervening rows between source node and target node. For example, Routing system 10 identifies the first obstacle below source (step 1028) and the first obstacle above target (step 1030). If the first obstacle below the source is not at least two rows lower than the first obstacle above the target. i.e., the accessible rows do not overlap, routing system proceeds to the next net if one is available (step 1032). If the rows overlap, a first row is selected for analysis (step 1034). Obstacles in the selected row are identified (step 1036), and if none are identified, a candidate route is plotted (step 1038). After the candidate route is plotted, routing system 10 determines whether the maximum routes criterion has been fulfilled (step 1040). If so, routing system 10 moves on to the next net. Otherwise, or if an obstacle is identified in the row, a new row is selected if one is available (step 1042). If not, a new net is selected, and if none is available, the plotting of type 2 routes is completed and exits (step 1044).

Route Selection

After the initial generation of candidate routes, compatible routes are suitably chosen from among the candidate routes (Steps 508, 510, 512). To arrive at a set of compatible candidate routes, any route incompatible with another route, whether the conflict is caused by geometrical or electrical constraints, is suitably removed from the set. For example, a compatibility graph is suitably created and manipulated to arrive at a compatible set of routes for at least some of the nets (step 508, FIG. 5). To identify conflicts among candidate routes, a data structure is suitably generated for representing the compatibility graph. Any of several data structures may suitably be used for representing graphs, such as adjacency matrices and adjacency lists. Adjacency lists are suitable for sparse graphs and adjacency matrices are suitable for dense graphs, though either or a combination of both or any other suitable method, may be used in accordance with the present invention.

The obstacles on the routing plane include the vias used for bringing the terminals to their proper routing layers and the line segments of routes that are routed in previous iterations. The obstacles are suitably stored in RAM 3112 or mass storage 3118. for example in linked list form or in a table form. In a linked list format, a list is compiled of the vias and line segments indexed by row and/or column coordinates. To determine whether a particular grid point is open, routing system 10 traverses the list using the index. This method minimizes memory requirements, but requires search time for large numbers of obstacles. In a table format, on the other hand, each grid point in the routing plane corresponds to an entry in the table. Consequently, lookup time is minimized, though the memory requirement is typically larger than that required for the linked list format.

Figure 12:
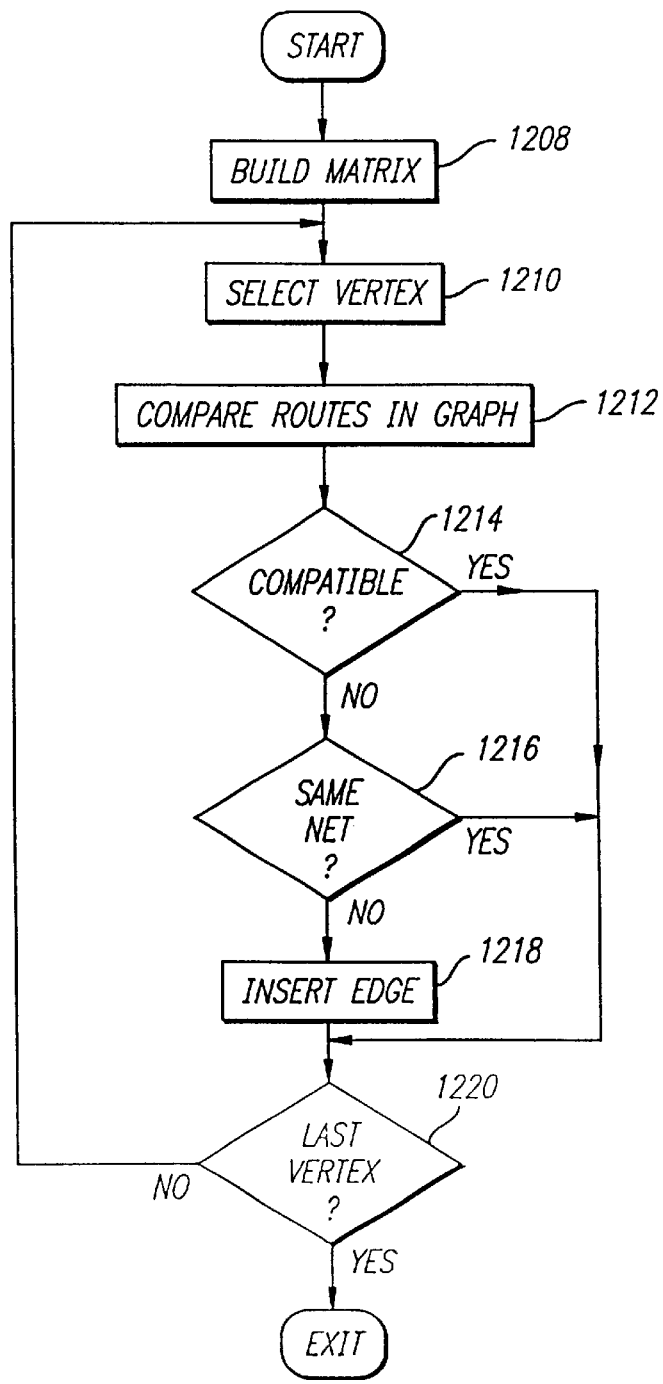
FIG. 12 is a flow diagram of a process for building a compatibility graph in accordance with the process of FIG. 5.
Figure 13:
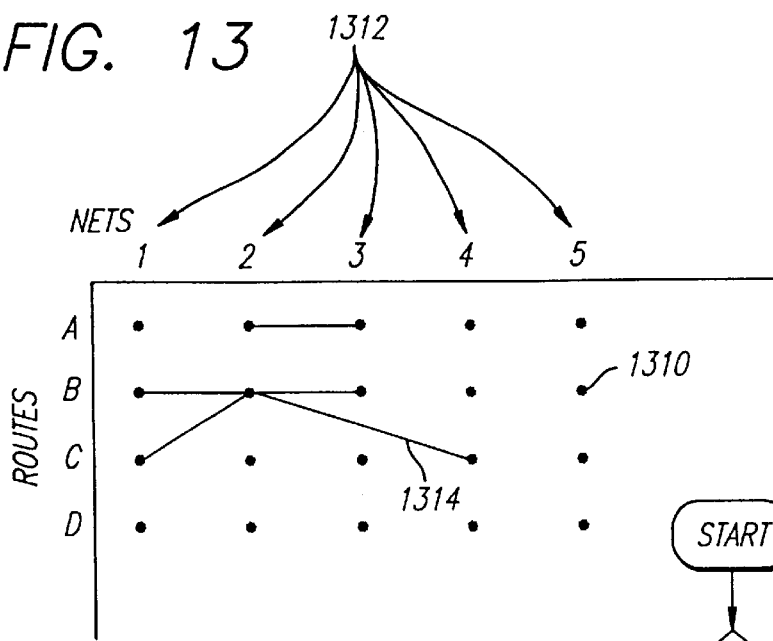
FIG. 13 is a diagram representative of a compatibility graph in accordance with the process of FIG. 12.

Referring now to FIGS. 12 and 13, a suitable compatibility graph is generated by representing each candidate route as a vertex in a matrix (step 1208). For example, each net is suitably associated with four candidate routes. Each net corresponds to a column 1312 in the graph, and each candidate route for the net is represented by a corresponding vertex 1310 in the matrix under the corresponding net's column. It should be noted that this arrangement is strictly for organizational purposes, and has no relation to the actual analysis below.

Routing system 10 selects a first vertex for analysis (step 1210). The selected candidate route is then compared to each of the candidate routes for other nets in the matrix for compatibility (step 1212). For example, the candidate routes suitably comprise a selection of grid points in the layers, which when organized in a sequence, define the route. These grid points may be compared, and a match of any grid point for any two candidate routes represents a potential incompatibility. If the candidate route represented by the selected vertex is compatible with all of the other vertices, the next vertex is selected for analysis (step 1214). If so, the routes are not with another, however, routing system 10 determines whether the conflict is with another route in the same multi-terminal net (step 1216). If so, the routes are not incompatible and the next route may be analyzed. If the conflicting routes are not in the same net, they are designated as incompatible (step 1218). For example, incompatibility is represented in the compatibility graph of FIG. 13 as a line, or an edge 1314, drawn between the conflicting vertices. If more vertices are available for analysis, the process repeats; if not, the process for building the compatibility graph is complete (step 1220).

Figure 14:
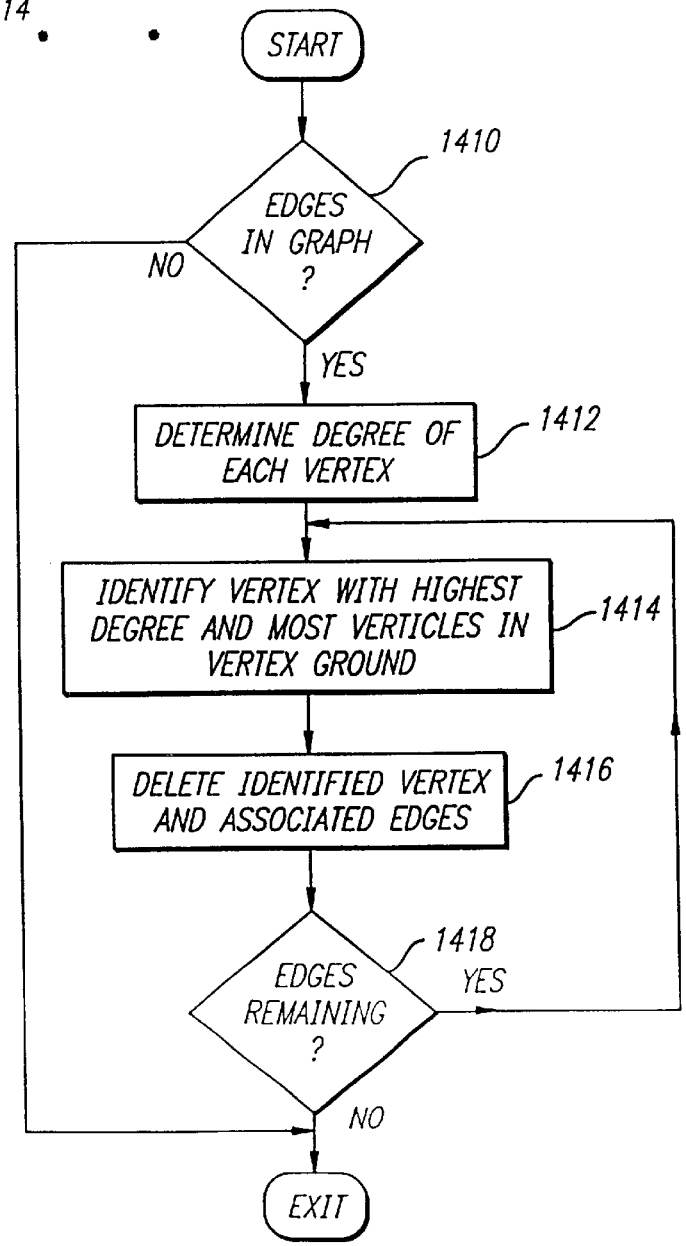
FIG. 14 is a flow diagram of a process for reducing the compatibility graph generated in accordance with the process of FIG. 12.
Figure 15:
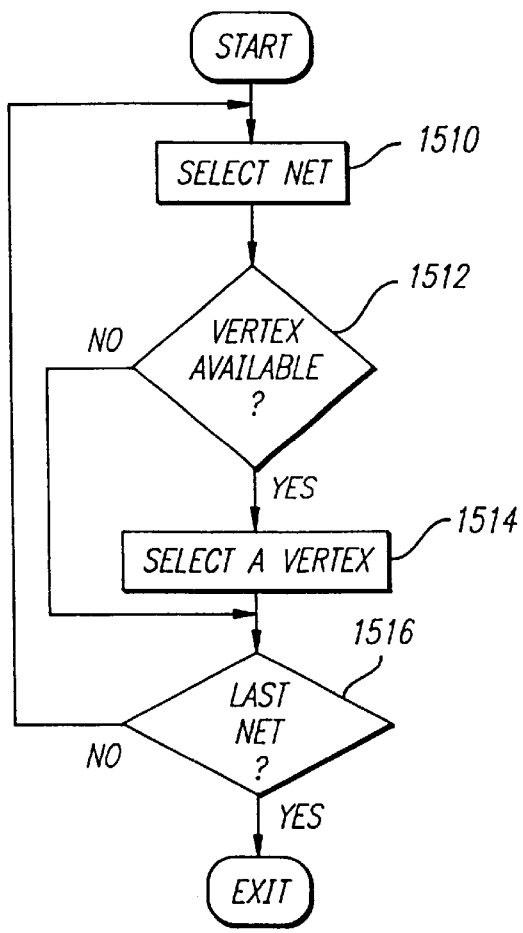
FIG. 15 is a flow diagram of a process for selecting routes based on a compatibility graph reduced in accordance with the process of FIG. 14.

When the graph is complete, the graph is suitably reduced to arrive at a fully compatible set of routes (step 510, FIG. 5). Referring now to FIG. 14, the graph reduction procedure initially determines whether any edges exist in the graph (step 1410). If not, the graph is already composed of fully compatible routes, so the graph reduction process is unnecessary and exits. If edges are present in the graph, the graph reduction process reduces the graph using any suitable technique, for example by deleting selected vertices from the graph. The deletion of vertices may be effected according to any suitable preselected criteria, such as how many edges are associated with a particular vertex. By eliminating the vertices with the most associated edges, the graph tends toward compatibility while deleting the fewest candidate routes.

For example, routing system 10 suitably determines the degree of, or number of edges associated with, each vertex (step 1412). The graph reduction process then suitably selects the vertex having the highest degree for deletion (step 1414). If more than one vertex has the same degree, other criteria, such as how many other candidate routes in the graph are associated with a particular net (i.e., in a particular vertex group), may be used to establish priority. The selected vertex is then deleted along with its associated edges (step 1416). The graph reduction process then determines whether any edges remain in the graph (step 1418). If so, the process iterates until all of the edges have been eliminated from the graph.

After reducing the graph, all of the remaining candidate routes are fully compatible, but some nets may include more than one compatible route. Therefore, routing system 10 may perform a final selection among the candidate routes for each net (step 512, FIG. 12). The process for finally selecting routes initially identifies an unplotted net (step 1510). If at least one vertex corresponding to the net remains, a vertex is selected according to predetermined criteria (steps 1512 and 1514). The particular vertex selected among multiple vertices may be decided under any appropriate criteria, for example the number of vias in the corresponding route. When a route has been selected for the present net, the selection process determines whether any further nets need to have a route selected (step 1516). If not, the selection process exits.

Finally, upon the completion of the first phase, routing system 10 determines whether another iteration is necessary (step 512). Whether another iteration is necessary may be decided according to any suitable criteria. In the present embodiment, routing system checks the iteration limiter provided during the parameter setting procedure. If the iteration limiter has not been passed, phase I repeats to generate more candidate routes. If not, routing system 10 initiates phase II of the routing process.

Phase II

Figure 16:
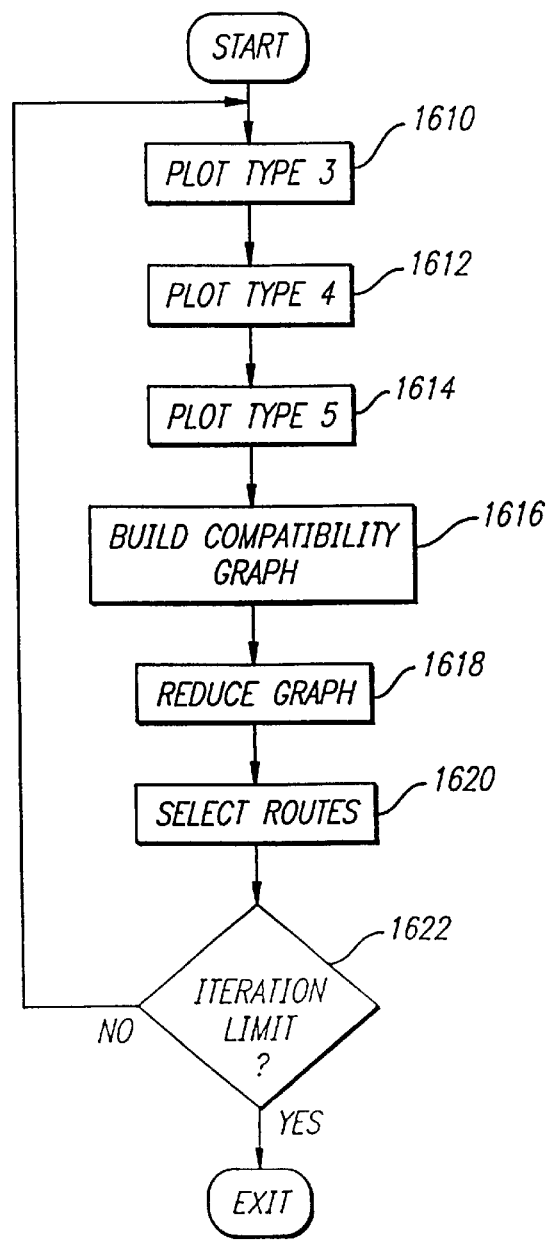
FIG. 16 is a flow diagram of a process for generating more complex routes in accordance with Phase II of the process represented by FIG. 3.

The second phase of the routing process suitably generates more complex candidate routes for the remaining unplotted nets. These routes contain more vias than the routes plotted in the first phase. The second phase may provide candidate routes of any complexity, for example routes having three to five vias. Referring now to FIG. 16, the second phase suitably generates more complex candidate routes for the remaining nets (steps 1610, 1612, 1614) and generates a compatibility graph, as described above (step 1616). The graph is reduced (step 1618) and the routes selected (step 1620) to arrive at a fully compatible set of routes (step 1620). It should be noted that routes plotted during the first phase are not included in the compatibility graph, but are instead suitably treated as obstacles to the candidate routes in the second phase. The second phase is then suitably repeated until the designer-defined iteration limit is reached (step 1622).

Type 3 Routes

Figure 17:
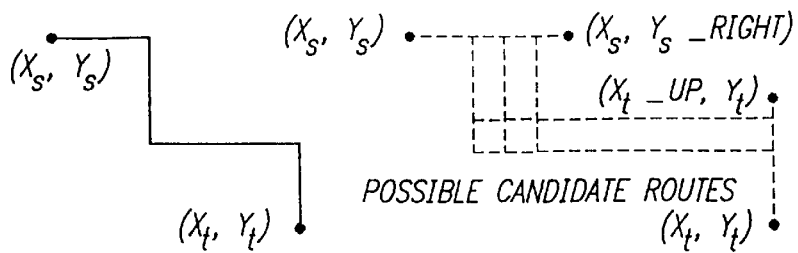
FIG. 17 is a diagram of a type 3 route and possible candidate routes.

Referring now to FIG. 17, the first part of the second phase (step 1610) generates type 3 candidate routes. A type 3 route includes three vias. In general, a type 3 route for a net is generated by selecting a point in the same row as the source and between the source and the rightmost obstacle in the row or the target column, whichever is closest to the source. The analysis described above for generating type 2 routes is then implemented from the selected point to the target node. The process is repeated for a point in the same column as the source and in a row between the source and the target row or first obstacle below the source, whichever is closest. When the resulting path is connected to the source, the result is a type 3 route.

Figure 18A:
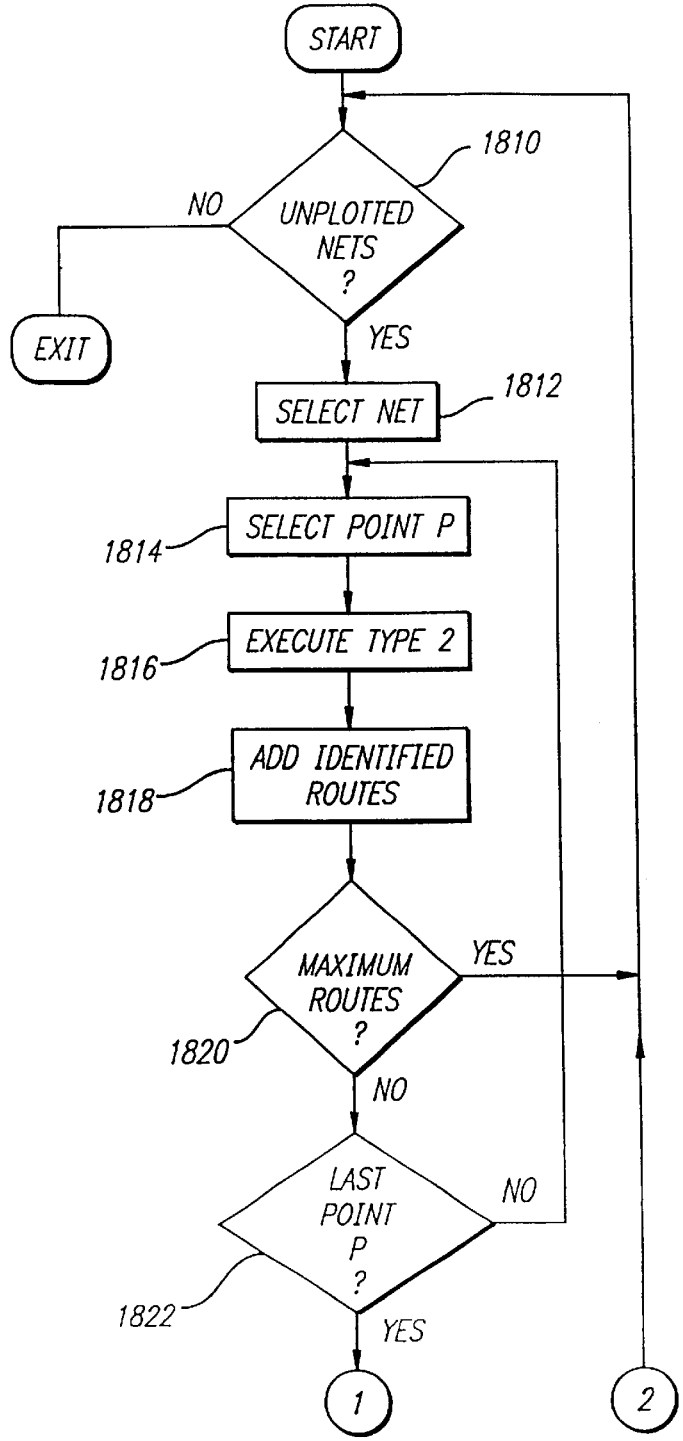
FIGS. 18A–B are flow diagrams of a process for generating type 3 routes in accordance with the process of FIG. 16.
Figure 18B:
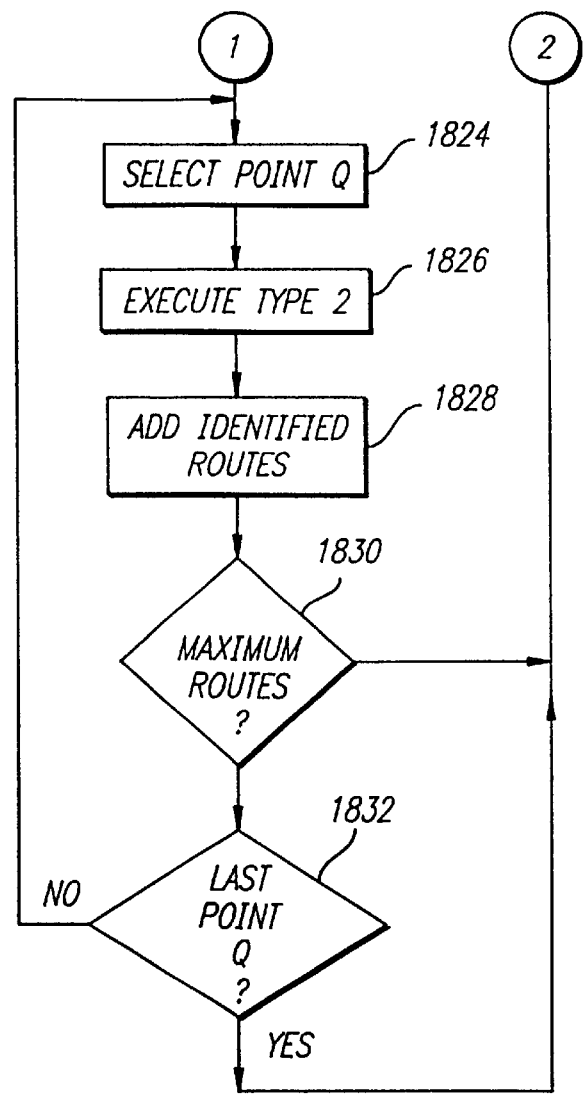
Figure 34A:
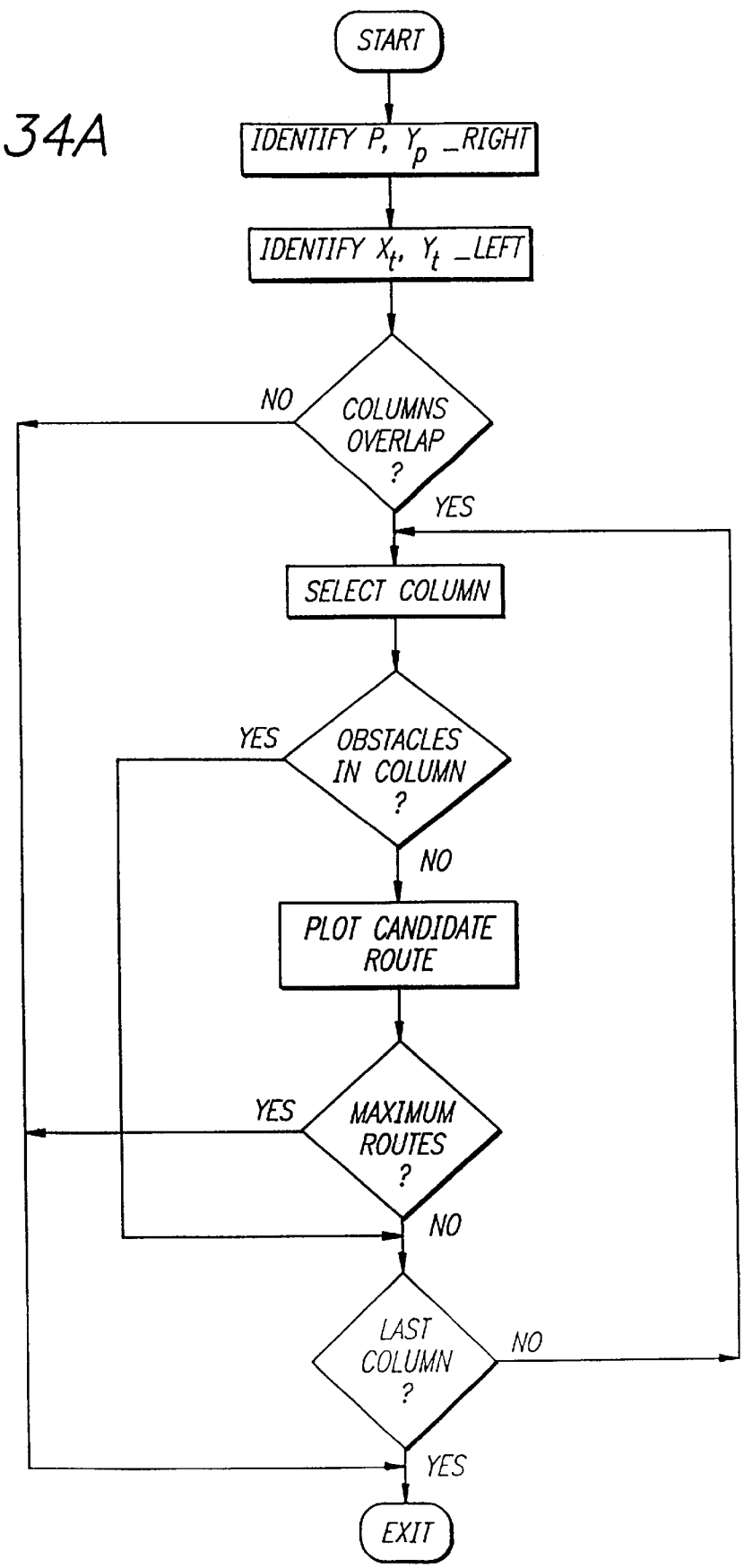
FIGS. 34A–B are flow diagrams of abbreviated processes for generating partial Type 2 routes.

Referring now to FIGS. 18A–B, a suitable type 3 route generation process determines whether any unplotted nets exist (step 1810). If so, an unplotted net is selected (step 1812), and a point P between the source and the target column, or as close to the target column as possible without encountering an obstacle, is selected (step 1814). An abbreviated type 2 process is then performed between the selected point P and the target node (step 1816). A suitable abbreviated type 2 process is illustrated in FIG. 34A. The type 2 process finds a route from the point P to the target, if one exists. If routes exist, they are connected to the source and added as candidate routes (step 1818). If any added route completes the requisite number of routes, a new net is selected (step 1820). In addition, if the current point is not the last point for analysis in the source's row, the process selects another point P and repeats the process (step 1822).

Figure 34B:
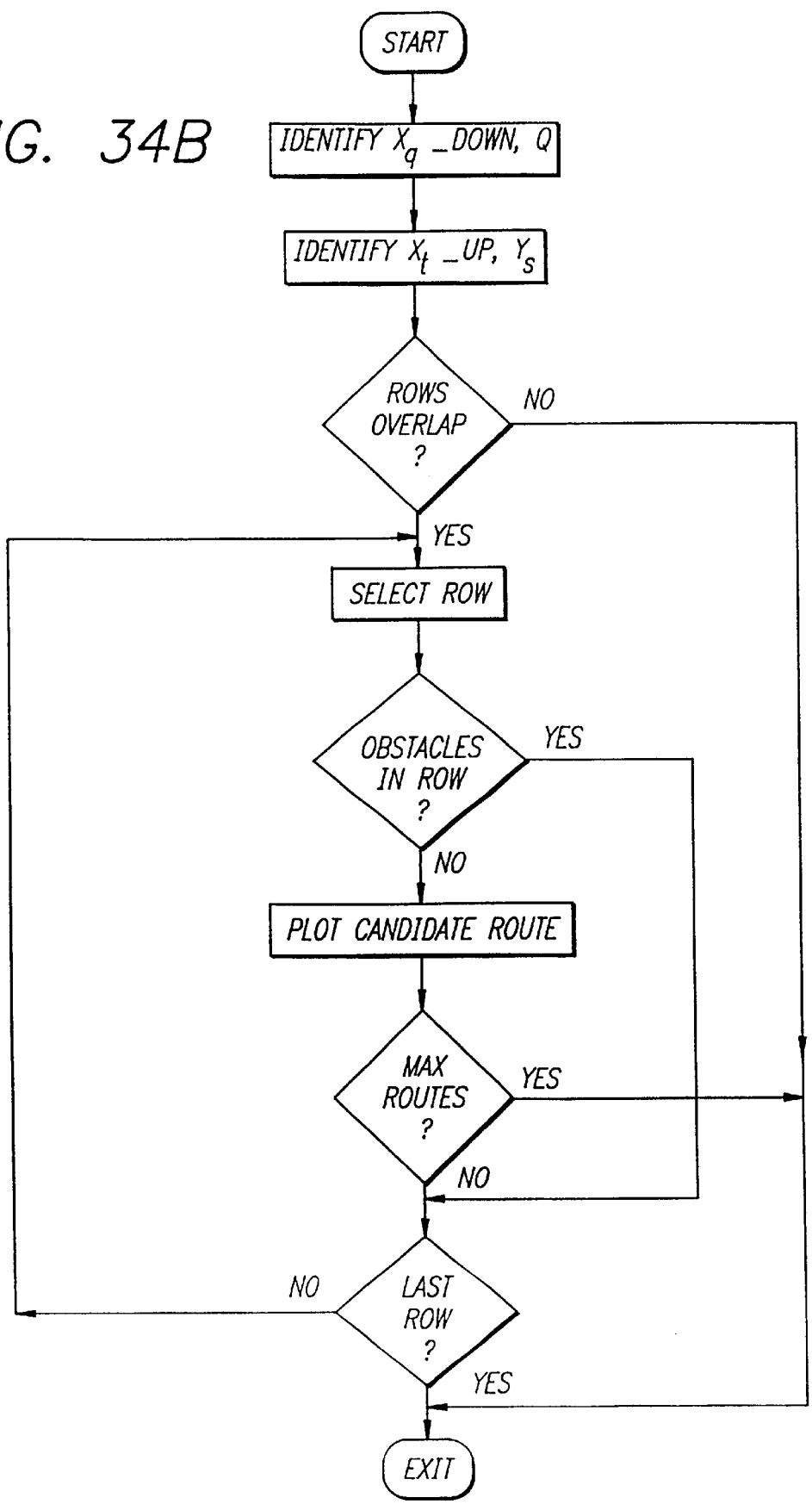

Otherwise, the system proceeds with a similar analysis for selected points in the source column. In particular, a point Q in the source's column and between the source and target row, or the first encountered obstacle, is selected (step 1824). A similar abbreviated type 2 routine, an example of which is illustrated in FIG. 34B is then executed using the selected point Q and the target (step 1826). If at least one route is found it is connected to the source and added as a candidate route (step 1828). If the maximum number of routes for the net have been generated, a new net is selected (step 1830).

If not, a new point Q in the source column is selected and the process repeated for the new point Q. If no such points are available, a new net is selected if available (step 1832).

Type 4 Routes

Figure 19:
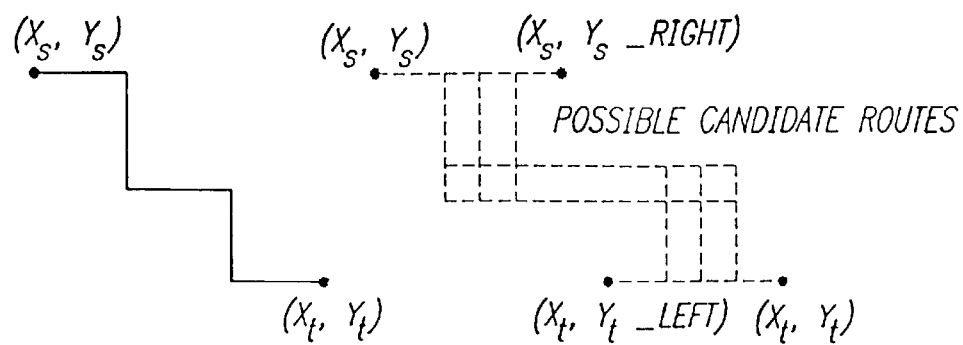
FIG. 19 is a diagram of a type 4 route and possible candidate routes.

After all type 3 candidate routes have been generated, the next step of the second phase suitably comprises generating type 4 candidate routes (step 1612). Referring now to FIG. 19, type 4 routes suitably include four vias between the source and target nodes. In general, type 4 routes are suitably developed by selecting a first point on the source row and a second point in the target row. The abbreviated type 2 process is then performed for these points, and any resulting routes are then connected to the source and target. The process is then repeated for each pair of points, and repeated yet again for each pair of points in the source's column and the target's column.

Figure 20A:
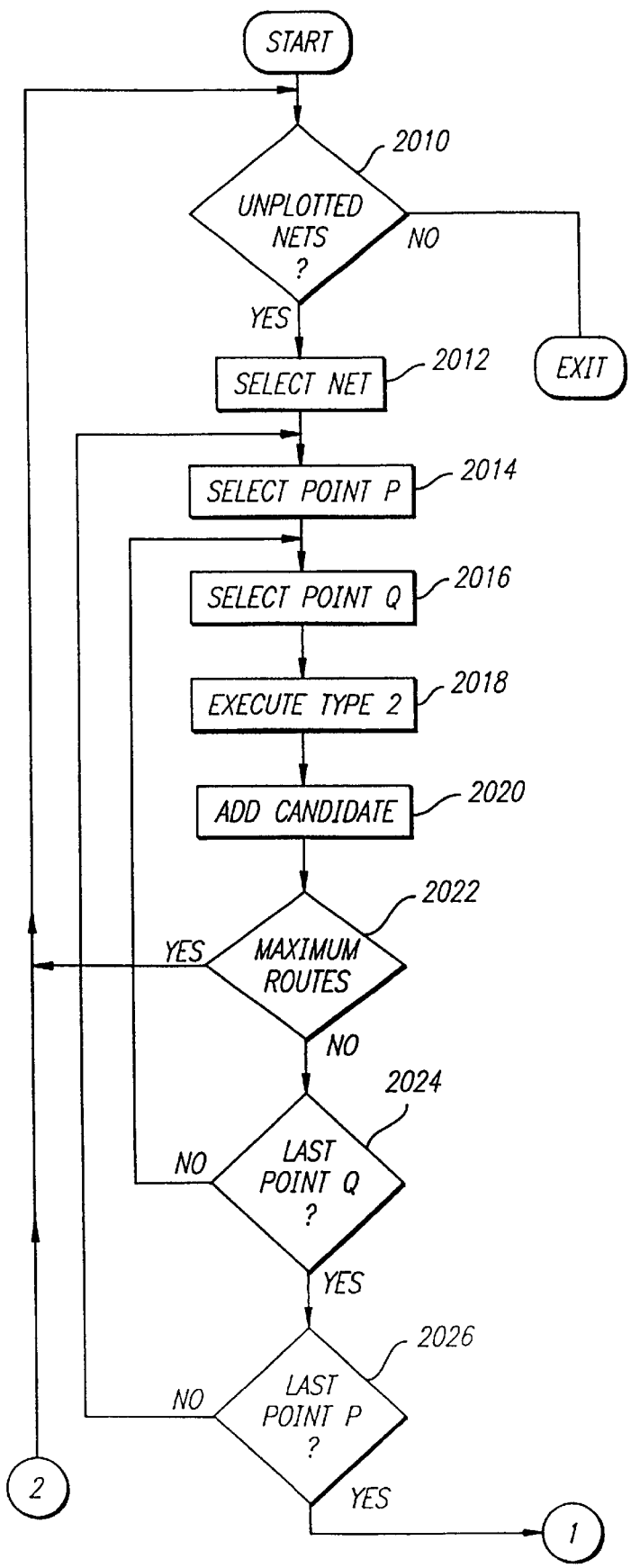
FIGS. 20A–B are flow diagrams of a process for generating type 4 routes in accordance with the process of FIG. 16.
Figure 20B:
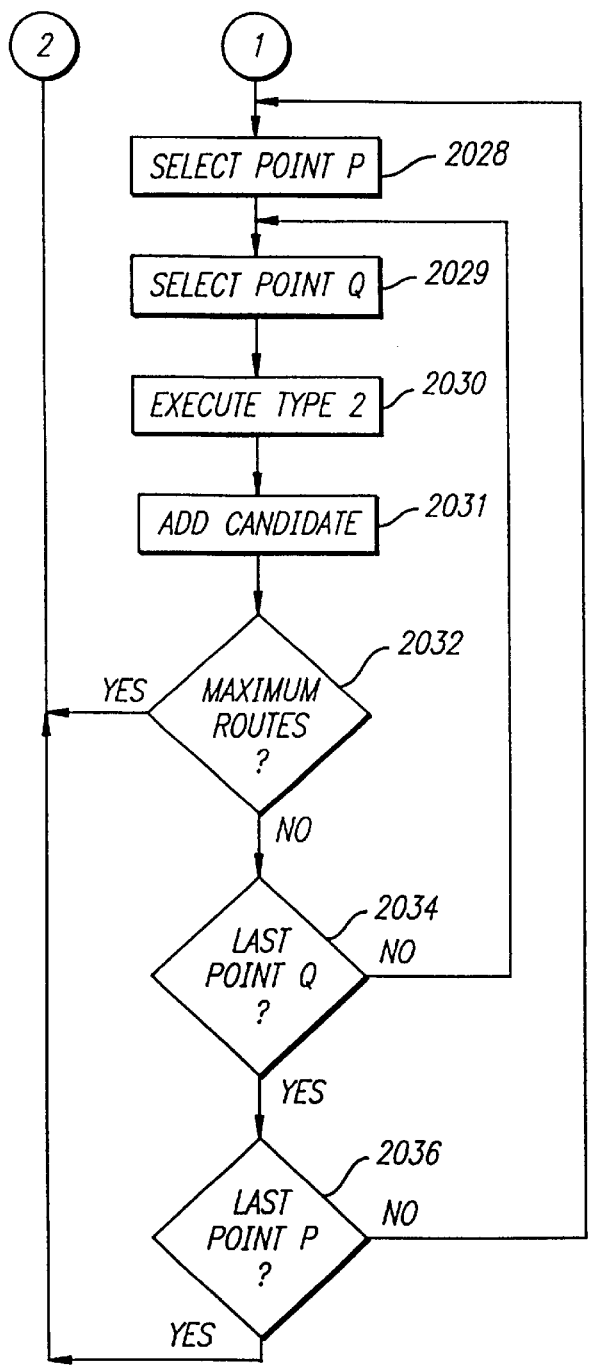

Referring now to FIG. 20, the type 4 process initially determines whether any unplotted nets remain (step 2010). If so, a first net is selected (step 2012) and a first point P in the source's row and between the source and target column or an obstacle in the row is identified (step 2014). Similarly, a second point Q in the target's row and between the target and the source column or an obstacle is identified (step 2016). An abbreviated type 2 routine is then executed for the selected points P and Q (step 2018). Any resulting routes are connected to the source and target and added as candidates (step 2020). If the maximum number of routes has been generated, a new net is selected (step 2022). If not, a new point Q is selected and the abbreviated type 2 process repeats (step 2024). If all of the point Q candidates have been analyzed, a new point P is selected and the process repeats (step 2026).

When all of the potential points have been analyzed, an analogous process repeats for all points P in the source column and all points Q in the target column (steps 2028 to 2036). When all of the potential type 4 routes between the source and target have been identified, a new net is selected if one is available (step 2038).

A routing system according to various aspects of the present invention suitably continues to provide candidate routes of increasing complexity according to the user's desires. As the complexity increases, however, the number of possible routes to be analyzed increases significantly, thus reducing the speed of the routing system. Thus, in one embodiment of the present invention, the second phase is limited to providing only type 3 and 4 routes.

Type 5 Routes

Figure 21:
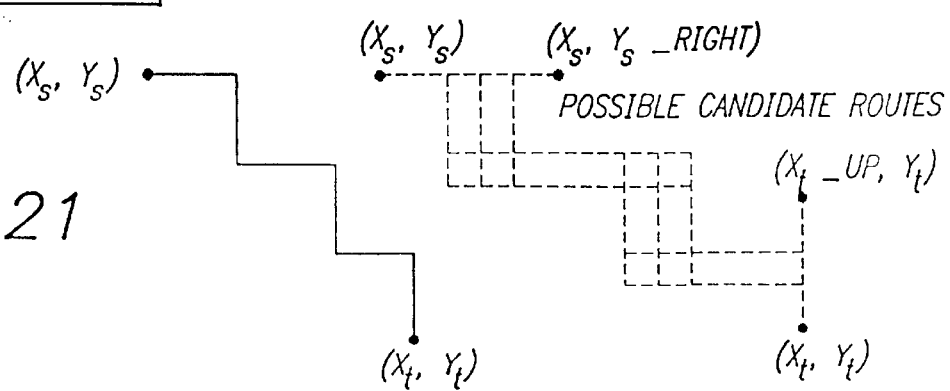
FIG. 21 is a diagram of a type 5 route and possible candidate routes.
Figure 22A:
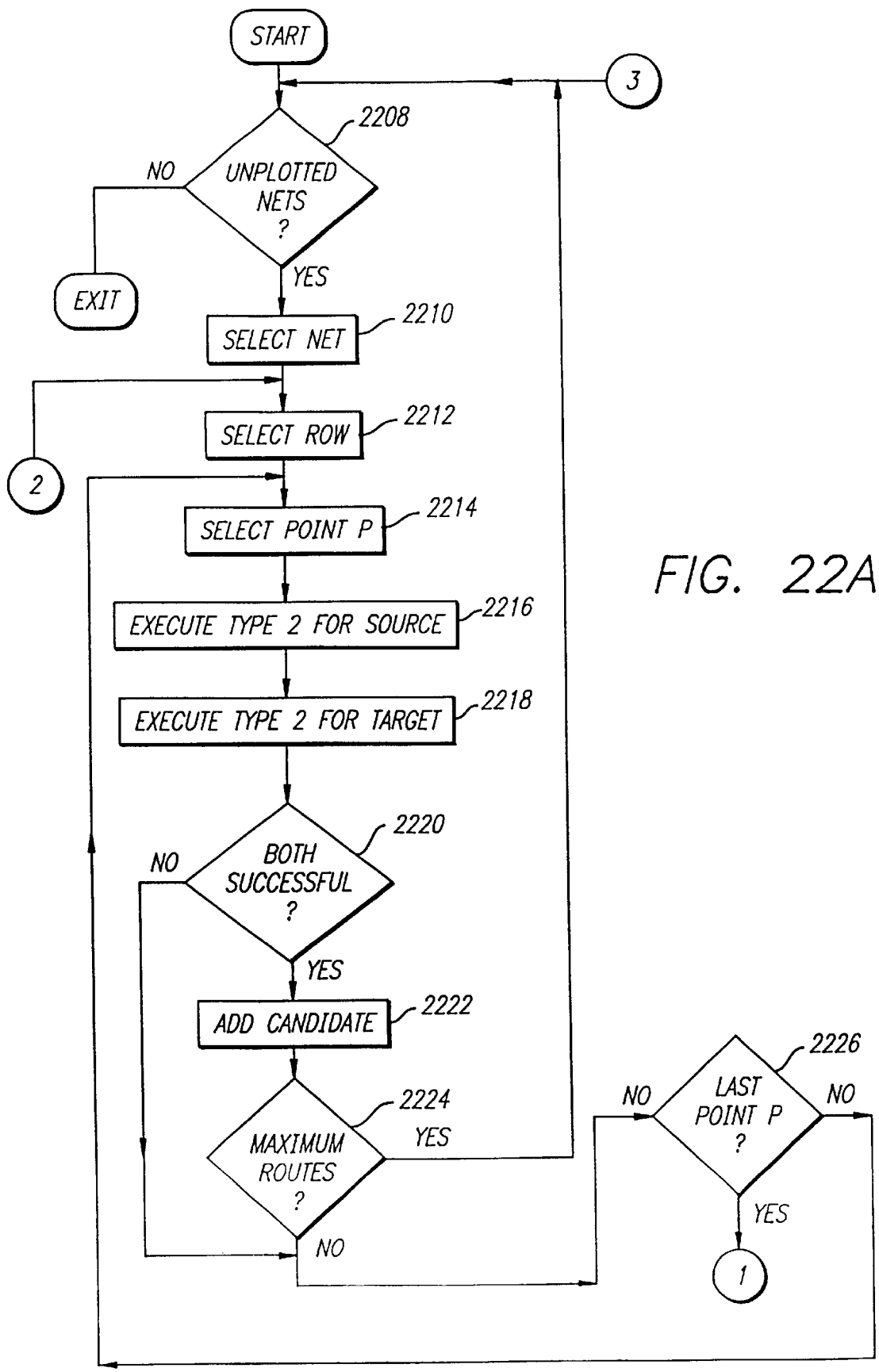

Type 5 routes may also be generated (step 1614, FIG. 16), however, according to user desires. For example, referring now to FIGS. 21 and 22A–B, a type 5 route includes five vias. A type 5 route is suitably generated by first selecting an unplotted net (steps 2208 and 2210), and then selecting a row between the source row and target row of the net (step 2212). Routing system 10 then selects a point in the selected row and between the source and target columns (step 2214), and an abbreviated type 2 routine is then executed for the source and point P (step 2216). The abbreviated type 2 process is also performed for the point P and the target (step 2218). If both type 2 processes generate routes (step 2220), the routes are connected and the resulting route added to the list of candidate routes (step 2222). If the maximum number of routes has been reached, a new net is selected (step 2224). If not, a new point P in the selected row is selected and similarly analyzed (step 2226). If all of the points in the row have been analyzed, a new row is selected. If all of the rows have been analyzed (step 2228), the process repeats for the next net until all of the unplotted nets have been analyzed.

Referring again to FIG. 16, upon completion of the type 5 route generation process, the routing system generates a compatibility graph for the candidate routes and reduces it as described above (steps 1616 and 1618). Particular routes are then selected according to the selection criteria (step 1620). If the iteration limit has not been reached, the second phase repeats. If so, the second phase is complete.

In an alternative embodiment, the second phase may be implemented such that each type of net is routed and reiterated until the iteration limit is reached. For example, the type 3 generation process may be executed followed by graph reduction and route selection. This is repeated until the iteration limit is reached. The process then starts over using the type 4 generation process, and again using the type 5 generation process.

Phase III

Upon completion of the second phase, the third phase (step 316, FIG. 3) suitably commences. Although the present embodiment is described as a process involving distinct phases and a certain number of phases, it should be noted that a system according to various aspects of the present invention is not limited to particular phases or a particular number of phases. In the present embodiment, the third phase suitably generates routes outside of the bounding box (FIG. 23), designated as type X routes, for each of the unplotted nets. Routes outside of the bounding box are less desirable than those within because of the increased wire length associated with such routes. Nonetheless, routes outside the bounding box may be the only suitable routes available, and may be effective for many nets. Thus, use of type X routes is limited to control costs and fulfill electrical constraints. In addition, it should be noted that the use of three phases and type X routes are not a requisite of a routing system according to the present invention.

Type X Routes

Figure 24A:
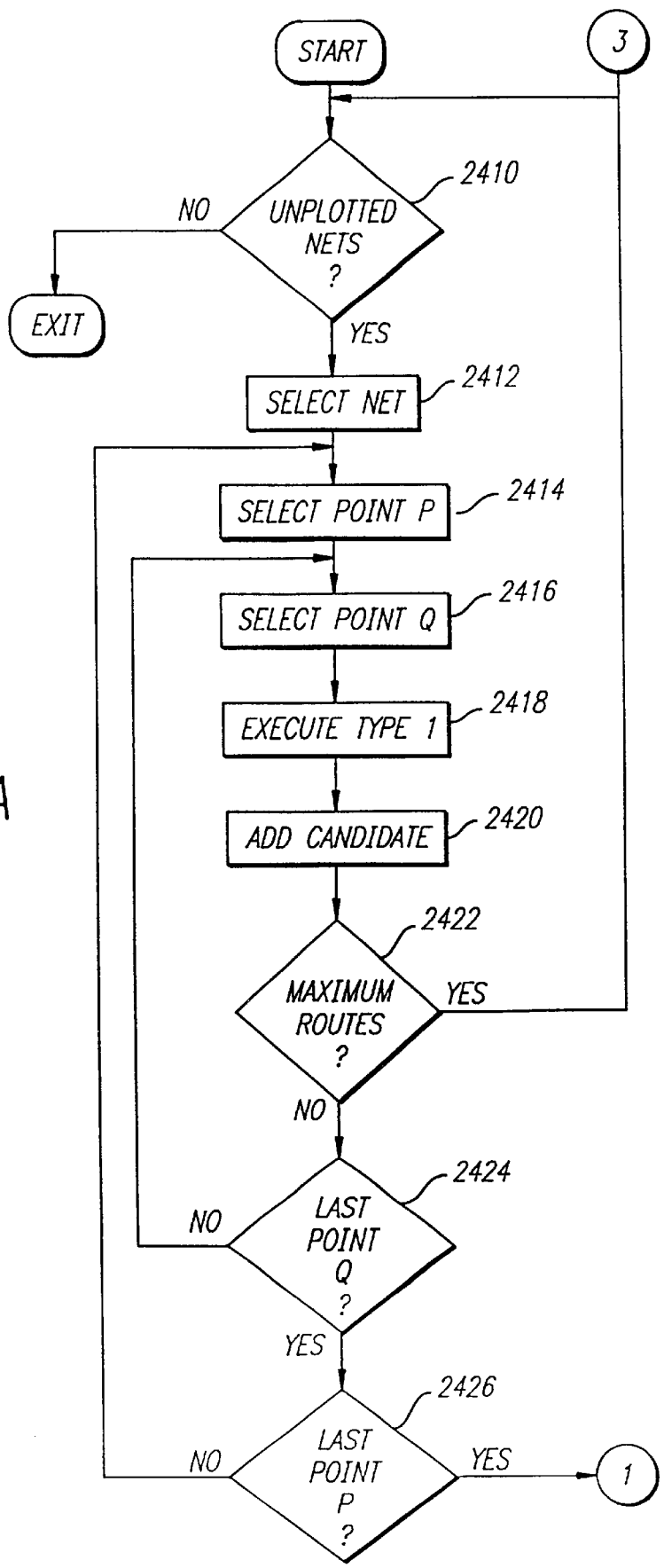
Figure 24B:
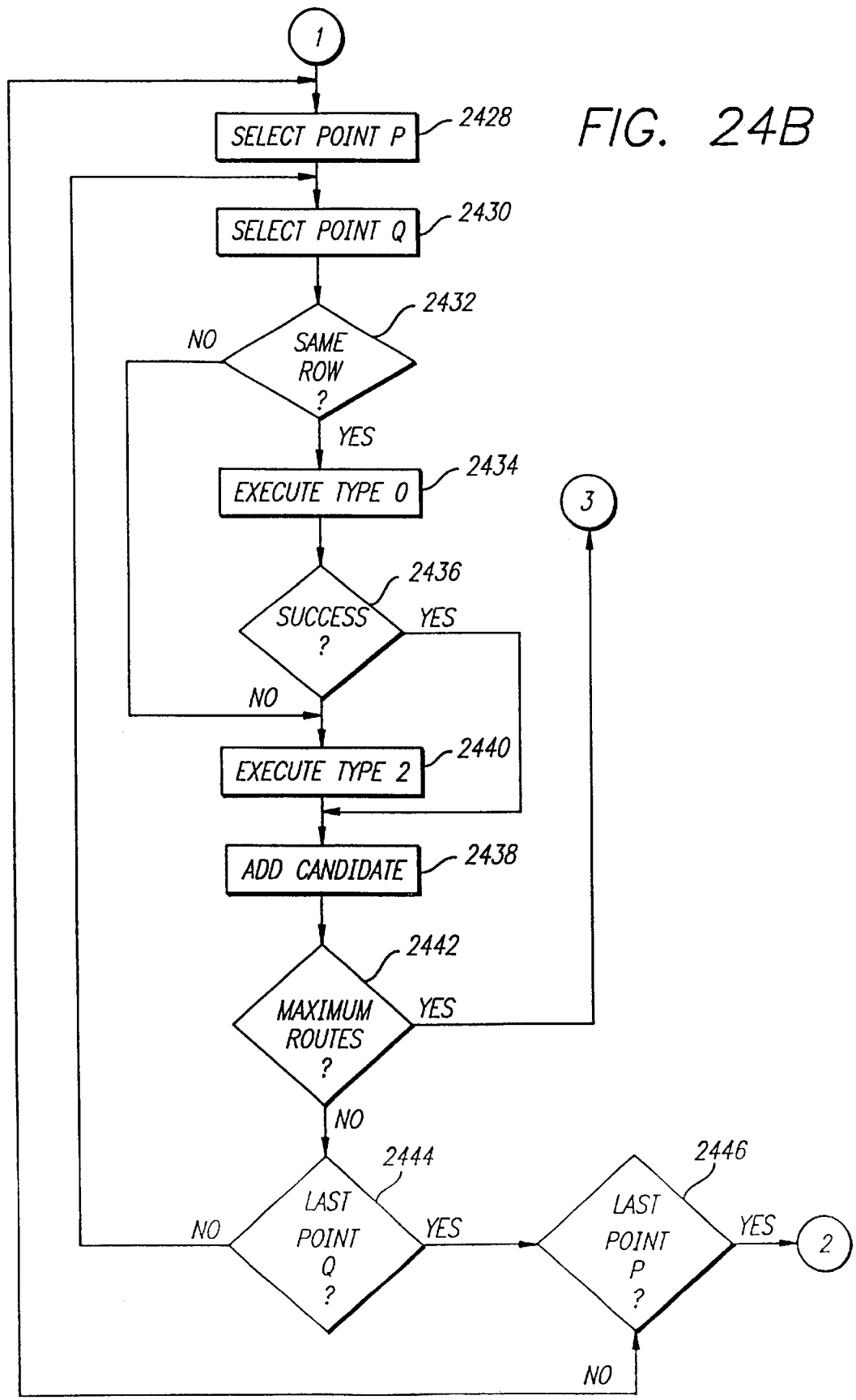

Referring now to FIGS. 24A–C, a suitable process for generating type X candidate routes suitably comprises identifying any unplotted nets (step 2410) and selecting an unplotted net for analysis (step 2412). In the source column, routing system identifies the first obstacle above the source and the first obstacle below, and similarly identifies the first obstacles in the target row to the left and right of the target. A first point P between the obstacles in the source column (step 2414) and a second point Q in the target row (step 2416) are selected. The distance of points P and Q from the source and target may be limited by defining an expanded routing box. Routing system then executes an abbreviated type 1 procedure to identify potential routes having a single via (step 2418). Any identified routes are designated as candidate routes (step 2420), and if the maximum number of routes for the net is fulfilled, the procedure proceeds to the next net (step 2422). If not, a new point Q is selected (step 2424), and if all of the available candidates for point Q have been analyzed, a new point P is selected (step 2426).

If all of the candidate points have been analyzed, a point P in the source column between the first obstacles in either direction is again selected (step 2428). Similarly, a point Q is selected between the first obstacles in either direction in the target column (step 2430). If points P and Q are in the same row (step 2432), an abbreviated type 0 analysis is executed to identify candidate routes (step 2434). If the type 0 procedure identifies a candidate route. the route is designated as a candidate (step 2436). If not, routing system executes the abbreviated type 2 procedure for points P and Q (step 2440). Any identified routes are similarly designated as candidates (step 2438), and routing system determines whether the maximum number of routes has been reached (step 2442). If so, a new net is selected; if not, a new point Q is identified (step 2444) and the process repeats. If all of the possible points Q have been analyzed, a new point P is identified for analysis (step 2446). If no more possible points are available for analysis, the process repeats using inverted rows and columns (step 2448), i.e., the type 1 analysis (steps 2414–2426) is performed for points P in the source row and points Q in the target column, and the type 0 and type 2 analyses (steps 2428–2446) are performed for points P in the source row and points Q in the target row.

Upon completion of the type X route generation, the routing system generates a compatibility graph for the generated type X candidate routes and reduces it as described above (steps 2450 and 2452). Particular routes are then selected according to the selection criteria (step 2454). If the iteration limit has not been reached, the third phase repeats (step 2456). If the iteration limit is reached, the third phase is complete.

Add Layers

Referring again to FIG. 3, when the third phase is complete, routing system suitably determines how many nets remain unplotted and compares the result to a threshold, suitably provided by the user (step 318). If the number of unplotted nets exceeds the threshold, a pair of layers may be added and phases one, two, and three repeat to route the remaining nets on the new layer pair (step 320). On the other hand, if fewer than the threshold number of nets remain unplotted, routing system executes a fourth phase to attempt to route the remaining nets on the existing layers (step 322).

Phase IV

Figure 25:
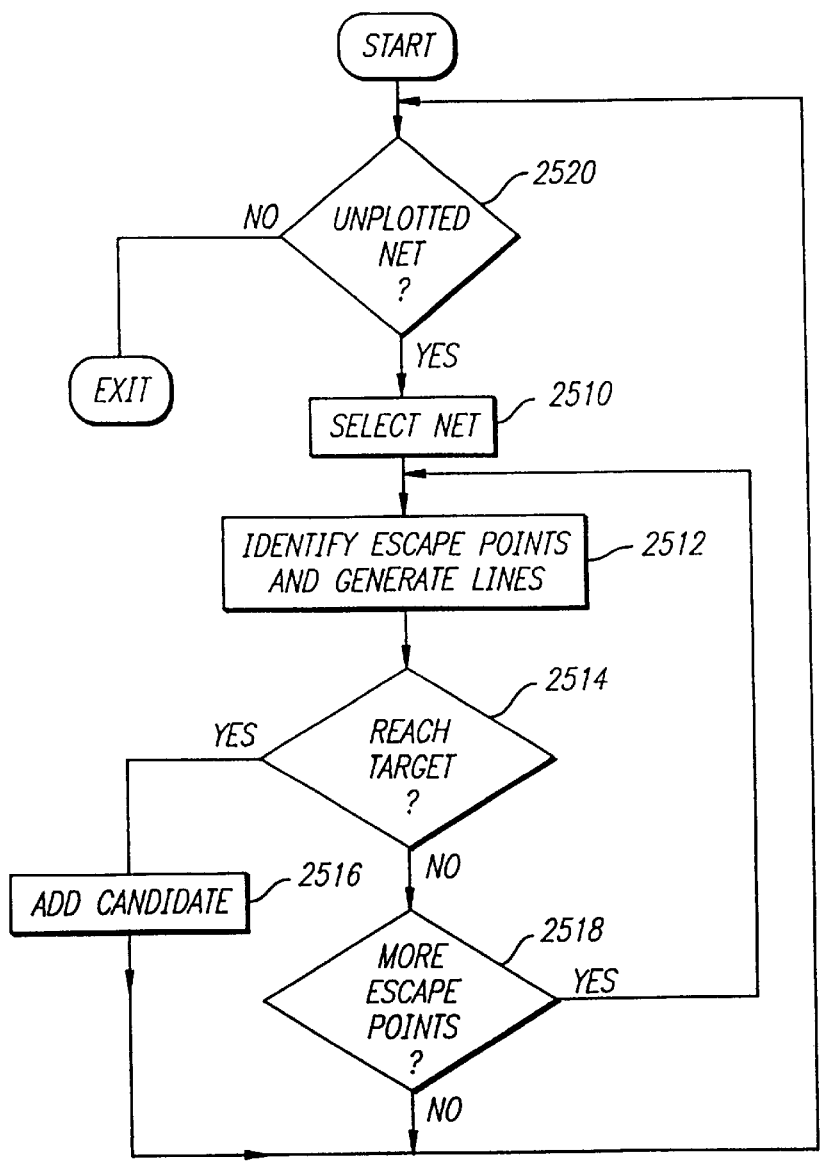
FIG. 25 is a flow diagram of a process for generating type Z routes.
Figure 26:
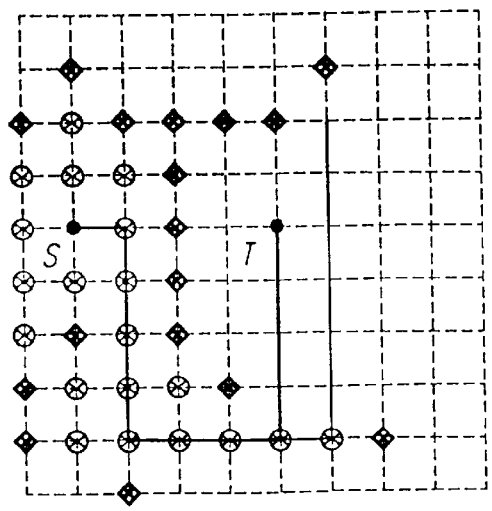
FIG. 26 is a diagram of a Type Z route.

Referring now to FIGS. 25 and 26, the fourth phase suitably uses a process to identify any possible routes for connecting the source and target of each unplotted net. Any process suitable for identifying possible routes may be used. For example, the fourth phase suitably uses a line-probe technique to plot type-Z routes for the remaining nets. A first net is selected (step 2510) for analysis, and all of the available escape points for the candidate route are identified. An escape point suitably constitutes any point in the proposed routes from which a perpendicular line may be extended without encountering an obstacle. Initially, no route is proposed, so the only escape point is the source. After identifying the escape points, perpendicular lines are extended from each escape point until the line encounters an obstacle (step 2512). Each of the resulting lines is analyzed to determine whether it encounters the target (step 2514). If so, the route is plotted for the net (step 2516). If not, a new set of escape points is compiled based on the new line segments, and the process repeats until no new escape points are generated (step 2518). This process is iterated for each unplotted net (step 2520).

It should be noted that the present system may operate without executing phase IV. In many cases, phase IV may be unnecessary and may be simply skipped. In other applications or circumstances, however, a suitable technique identical or analogous to phase IV may be implemented to identify possible routes for unplotted nets.

Post Routing

Figure 27:
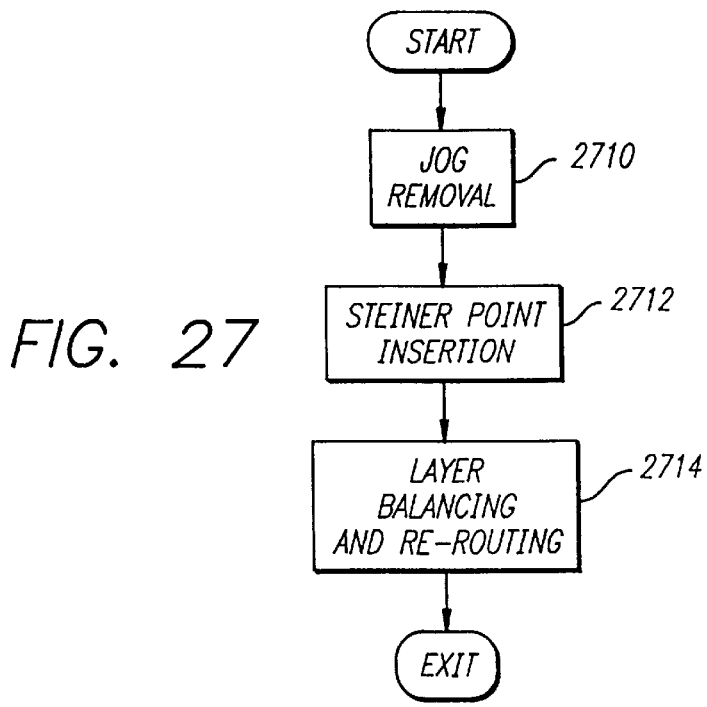
FIG. 27 is a flow diagram of a post-routing processing procedure in accordance with the process of FIG. 3.
Figure 28A:
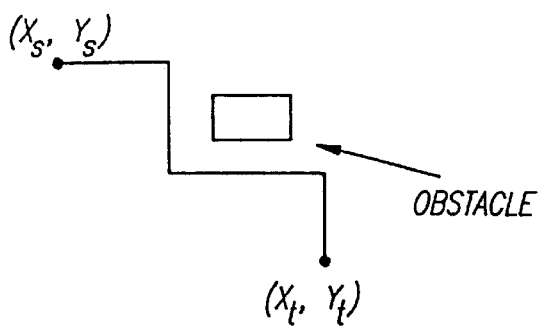
FIGS. 28A–B are diagrams of a route before and after jog removal.
Figure 28B:
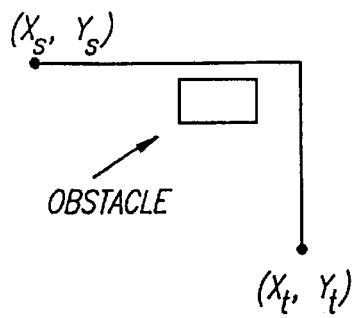
Figure 29A:
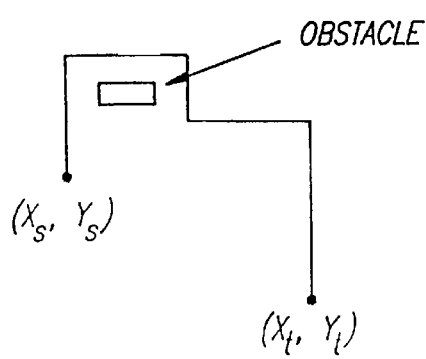
FIGS. 29A–B are diagrams of a second route before and after jog removal.
Figure 29B:
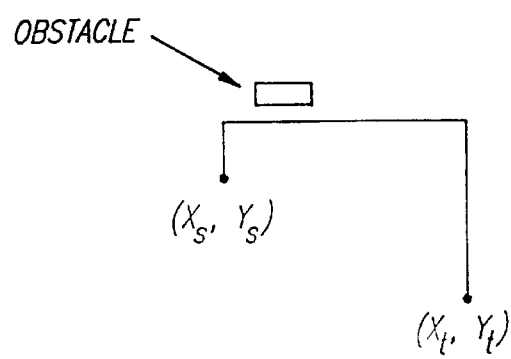

Upon completion of the fourth phase, routing system 10 determines whether all of the remaining nets were successfully routed on the existing layers (step 324). If not, routing system 10 discards the routes generated in the fourth phase, adds a layer pair, and repeats the initial three phases. When all nets are successfully plotted, routing system 10 executes a suitable post-routing processing procedure to enhance performance and design. For example, referring now to FIG. 27, a post-routing processing procedure suitably includes jog removal (step 2710), Steiner point insertion (step 2712), and layer balancing (step 2714). Referring now to FIGS. 27–29, jog removal suitably comprises identifying unnecessary routing around obstacles which increase route length. For example, as shown in FIGS. 28A and 29A, routes may be plotted around obstacles that increase the wire length or number of vias. If a straighter route is available, however, the jog removal routine eliminates the jog to arrive at a more suitable route (FIGS. 28B and 29B).

Steiner point insertion suitably comprises identifying multi-terminal nets where they have been subdivided into multiple nets and recombining them where possible. For example, a multi-terminal net in FIG. 30A comprises two nets 3010 and 3012. The Steiner point insertion process inserts a node, if possible, to reduce the overall length of the route to each terminal.

Layer Balancing

Finally, a layer balancing procedure suitably redistributes routes from one layer pair to another. Typically, when the present routing process is completed, the nets are unevenly distributed among the layer pairs, such that the top layer pairs tend to have many more routes than lower layer pairs. For example, a first layer pair may be extremely densely packed with routes, while a second layer pair contains only half as many. Consequently, upper layer pairs tend to have very high routing density and lower layer pairs have excess area. Although high density routing reduces the number of layer pairs required, it also tends to generate or aggravate manufacturing and electrical problems. In addition, high density routing tends to induce crosstalk and fabrication problems. To minimize interference and manufacturing difficulties it may be suitable to reroute some of the nets originally routed on a first layer pair to a second layer pair to balance the route density among the various layer pairs. Layer balancing tends to relieve the problems associated with high density routing on the upper layers without adding further layers.

Figure 35A:
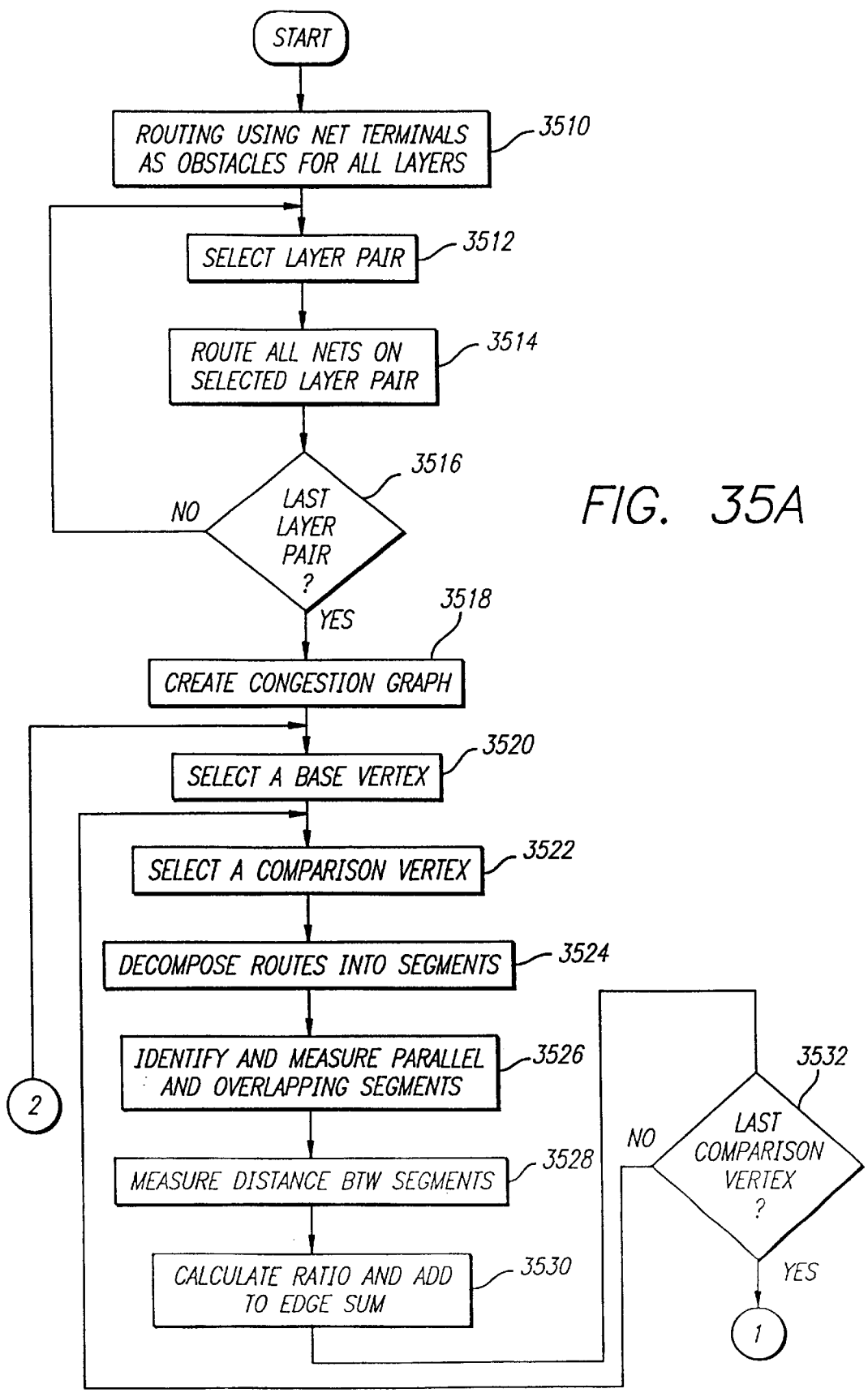
FIGS. 35A–B are flow diagrams of a process for layer balancing.
Figure 35B:
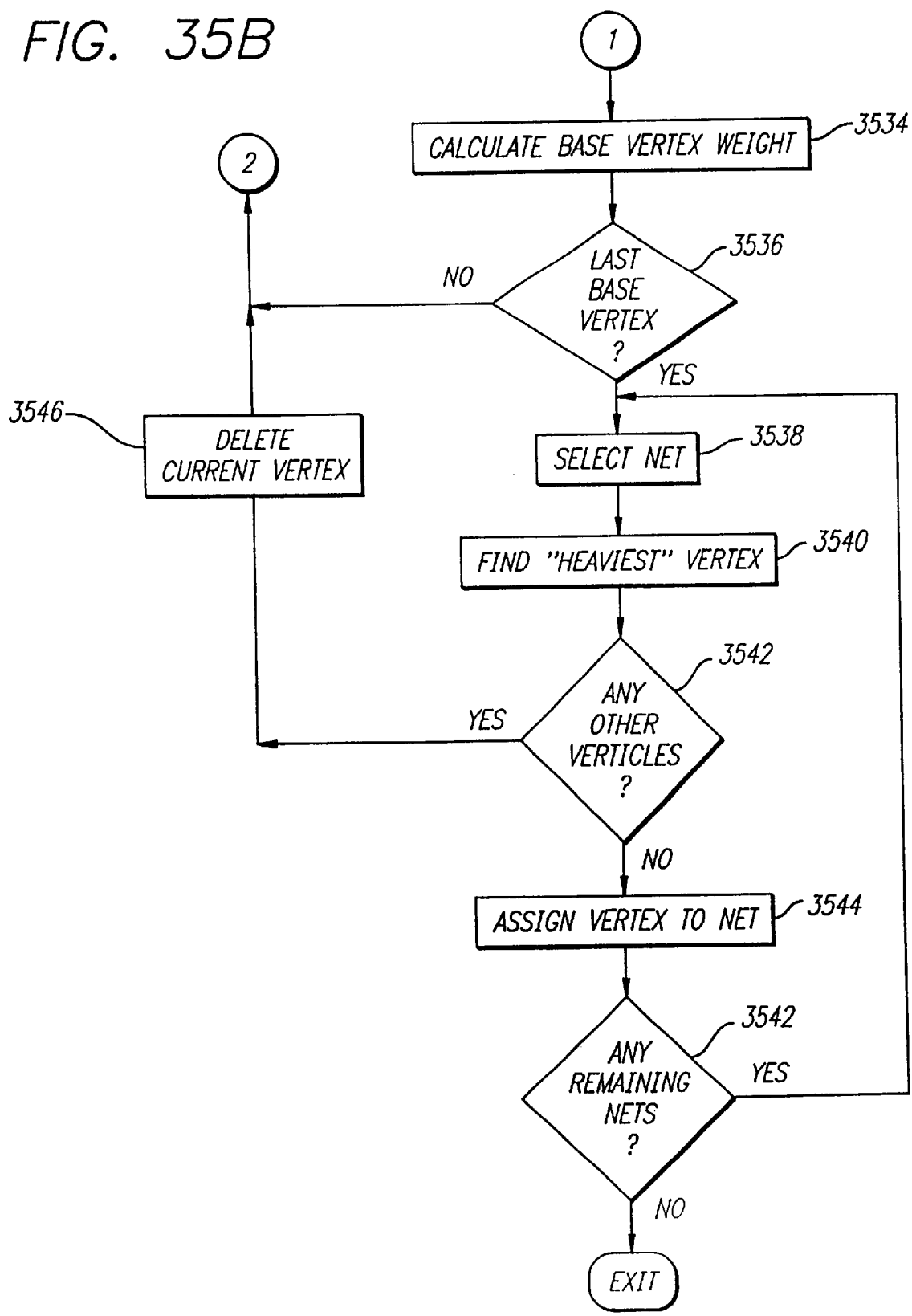

Referring now to FIG. 35 to implement layer balancing according to a first embodiment of the present invention, the initial routing process (steps 310 to 324 of FIG. 3) is performed slightly differently. If layer balancing is not to be implemented, only information regarding unrouted nets is propagated to the next layer when a layer pair is added. Terminals of nets which are routed in the previous layer pairs are not treated as obstacles for the following layer pairs.

For layer balancing according to the present embodiment, however, the terminal locations for all nets, routed or unrouted, are treated as obstacles on every layer (step 3510). When layer balancing is implemented after routing, routing system 10 suitably initiates redundant routing. In this step all nets routed on a particular layer pair are designated as obstacles. Routing system 10 then generates at least one candidate route on the current layer pair, if possible for each net initially routed on the other layer pairs (steps 3512, 3514). This process is repeated for each layer pair (step 3516).

Subjecting each layer pair to redundant routing for nets originally routed on other layer pairs results in some nets having multiple candidate routes, each of which is on a different layer pair. To facilitate balancing, the congestion of each layer pair must be evaluated. For example, routing system 10 suitably generates a congestion graph representative of the congestion associated with each layer pair (step 3518). A congestion graph according to various aspects of the present invention suitably comprises, like the compatibility graph previously discussed, a vertex corresponding to each route associated with a particular layer pair. After a vertex is associated with each route, one of the vertices, referred to herein as a base vertex, is selected for analysis (step 3520). A second vertex is then selected for comparison (the comparison vertex (step 3522). An edge is associated with the pair of vertices and assigned a weight according to preselected weighting criteria designed to correspond to the congestion associated with the two routes corresponding to the vertices.

For example, to associate a congestion weight with a particular edge, each route associated with the vertices is suitably decomposed into individual segments (step 3524). Each segment of the first route that is parallel to one or more segments associated with the second route is identified. The extent to which the parallel segments overlap is first established (step 3526). In other words, referring to FIG. 36. routing system 10 determines the distance Y corresponding to the distance over which parallel segments 3612, 3614 are adjacent. The distance between parallel segments 3612, 3614, that is the distance X, is then established (step 3528). Routing system 10 then suitably calculates a ratio of the overlap Y to the distance X. This process is repeated for each of the parallel segments associated with the two routes, and all of the resulting ratios are added to arrive at a weight for the edge (step 3530). Thus, the resulting sum increases for routes that are parallel to, overlapping with, and close to other routes on the layer pair.

The entire process for generating weights associated with edges is suitably repeated for every vertex. Consequently, routing system 10 selects a new comparison vertex for creating a weighted edge (step 3532). When all of the relevant edges have been assigned weights, the base vertex is assigned a corresponding weight according to a suitable algorithm (step 3534). For example, routing system 10 suitably defines the weight of the base vertex as the sum of all weights corresponding to its incident edges.

If a weighted edge has been generated for every available comparison vertex in the relevant layer pair, the process repeats for a new base vertex (step 3536). The ultimate result is a series of edges wherein every vertex is assigned an edge corresponding to every other vertex in the graph. Every edge is associated with a weight corresponding to the congestion ratio between the corresponding routes, and every vertex is assigned a weight corresponding to the incident edge weights.

After a weight has been established for each vertex, the resulting congestion graph may be used to select an optimized set of routes. For example, an initial net is selected (step 3538), and the weights of each of the various vertices associated with the net are suitably initially compared to identify the vertex having the highest weight (step 3540). If the vertex having the highest weight is the only remaining vertex (i.e., candidate route) associated with the route (step 3542), the candidate route corresponding to the vertex is assigned to the net (step 3544). If not, the vertex is deleted from the congestion graph (step 3545), the congestion graph and weights associated with the remaining vertices are regenerated, and the process repeats until every net is routed (step 3548). When the process is complete, several of the candidate routes are typically routed to less congested layer pairs.

Rerouting

Figure 37:
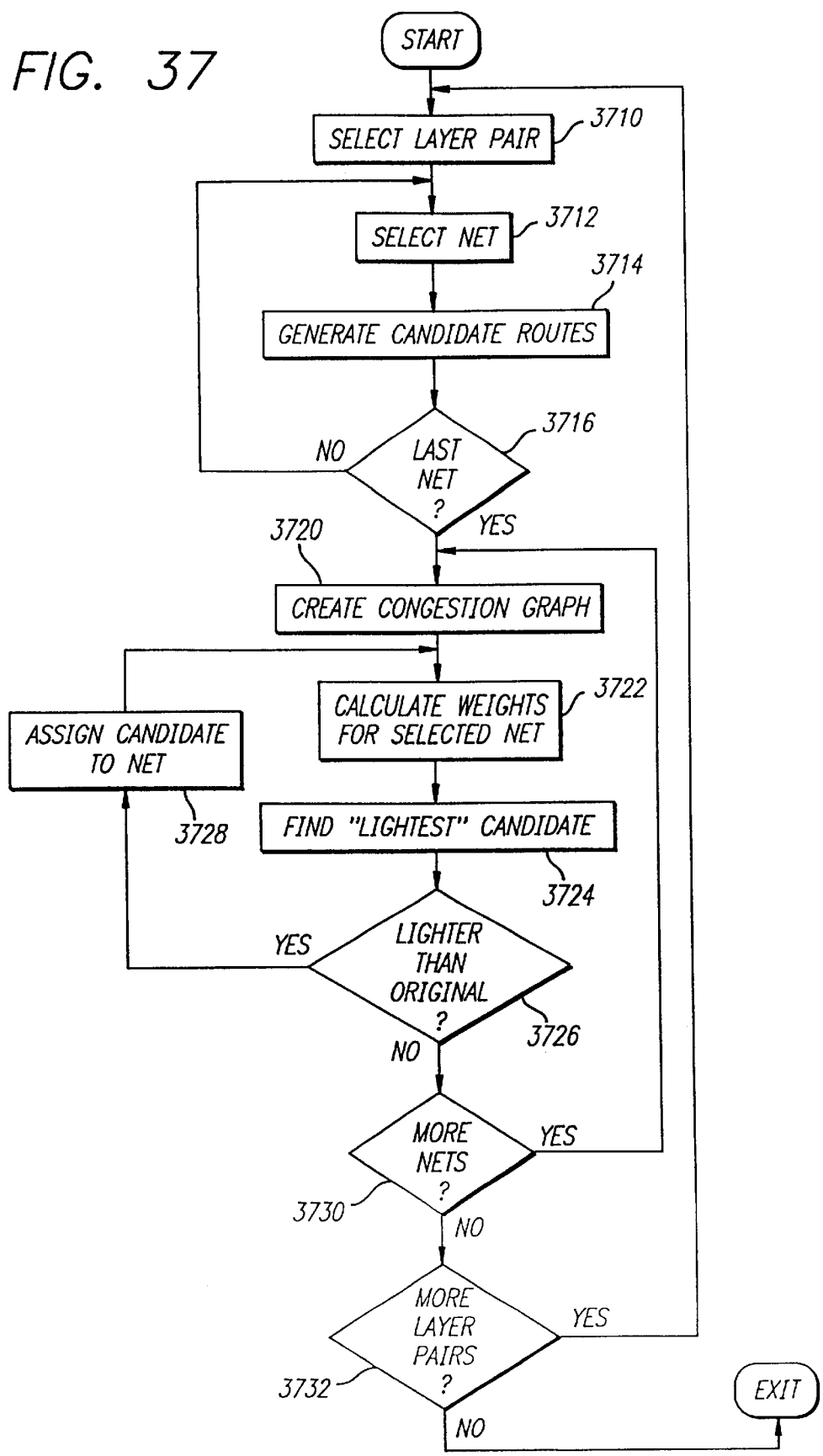
FIG. 37 is a flow diagram of a process for rerouting nets on a layer pair.

Following layer balancing, various nets are suitably rerouted. Layer balancing tends to distribute nets more evenly over the various layer pairs, while rerouting tends to more evenly distribute nets over any given layer pair. For example, referring now to FIG. 37, a first layer pair to be analyzed for rerouting is suitably selected (step 3710), and a congestion graph, such as the congestion graph described above, is generated for all of the routes on the layer pair. A first net is selected (step 3712), and all other routes are designated as obstacles. Routing system 10 then suitably generates a selected number of candidate routes (step 3714), for example one to four candidate routes, for the selected net. Preferably, the candidate routes are limited to only type 0, type 1, type 2, or type 3 routes. In addition, each candidate route preferably has no more vias than the originally plotted route.

When the candidate routes have been generated for a net (step 3716), a congestion graph is created for the net (step 3720). The weight for each of the candidate routes, such as the weight described above, is then calculated (step 3722). When all of the weights for the candidate routes have been plotted, the weights are compared to identify the candidate route having the lowest weight (step 3724). If two routes have the same weight, the selection may be based on secondary criteria, such as the route having the fewest vias.

After selecting a candidate route, the weight of the selected candidate route is compared to that of the original route (step 3726). If the original route's weight is lower, the original route is retained for the net. On the other hand, if the selected candidate route's weight is lower, the candidate route replaces the original route for the net (step 3728). Routing system 10 then suitably regenerates the congestion graph using the new route for the selected net. The process then repeats for the next net until all of the nets on the layer pair have been analyzed for rerouting (step 3730). This process is suitably performed for each layer pair (step 3732).

In sum, Routing system 10 thus generates candidate routes and analyzes them for compatibility. Multiple candidate routes are suitably generated for each net, which are then analyzed for compatibility. Incompatible routes are selectively deleted from the configuration to arrive at a fully compatible set of routes. Incompatibility may be based upon any criteria, including obstruction or electrical constraints. Ultimately, the process arrives at a fully compatible set of routes, or adds another layer pair as may be necessary to accommodate all of the nets.

It should be noted that the present techniques for layer balancing and rerouting are only examples of suitable methods and apparatuses for accomplishing particular design goals. Any other suitable system or criteria for layer balancing or rerouting, if desired, may be included in a system according to the present invention. In addition, in various applications, the layer balancing or rerouting processes may be limited or omitted entirely, if desired.

Single Layer Routing

In addition to regular two-layer routing, a routing system according to the present invention may be applied to single-layer routing. Single-layer routing may be desirable under certain conditions, for example to route a critical net on a single layer due to electrical considerations. To implement single-layer routing, the compatibility test must be altered because nets that would not conflict in a two-layer configuration may well conflict in a single-layer configuration. In addition, some types of routes may be less suitable for single-layer routing, such as type-X routes, and others, such as type-Z routes, may be more useful.

Figure 32:
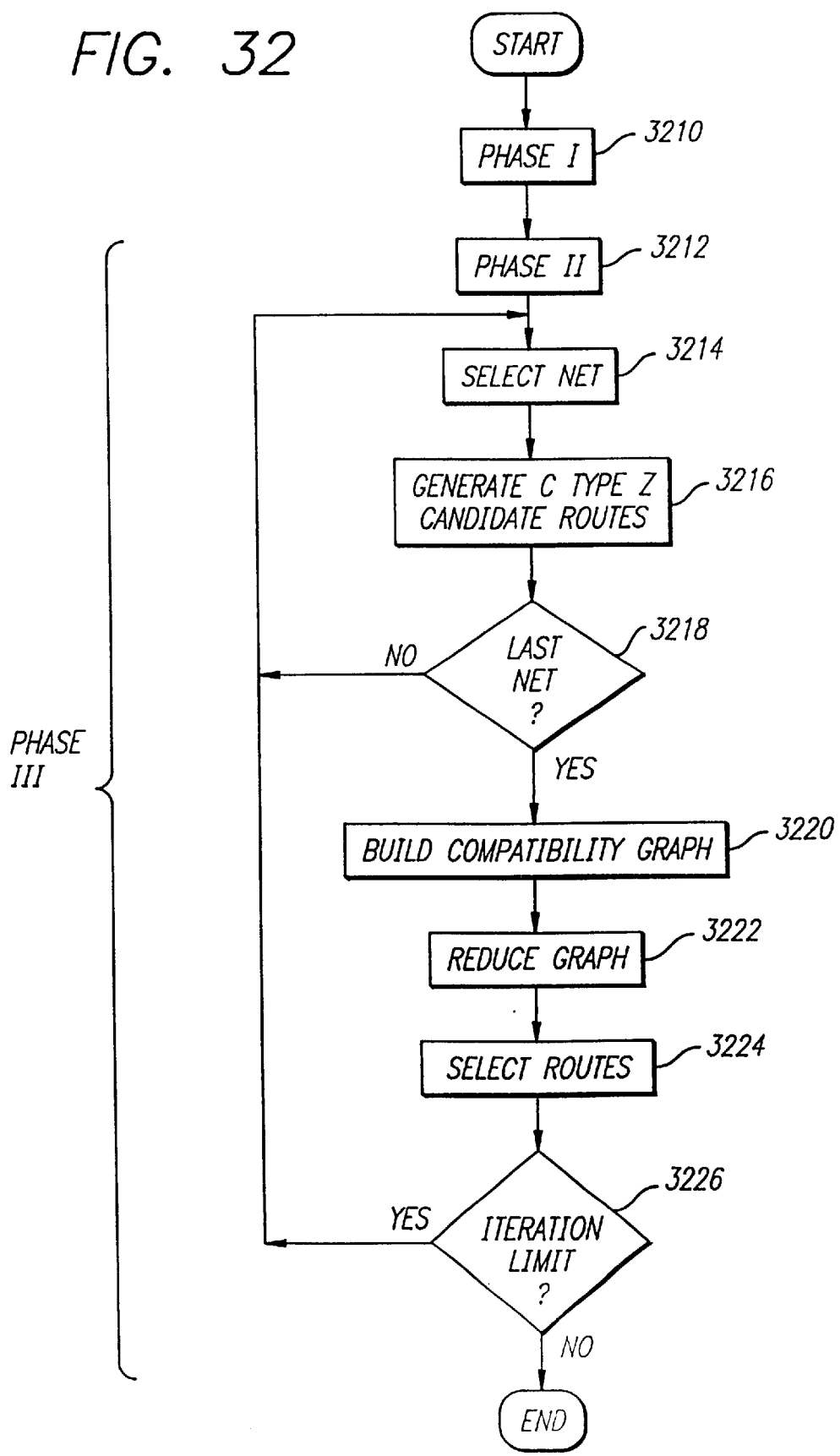
FIG. 32 is a flow diagram of a process for performing single-layer routing.

An exemplary process for implementing single-layer routing suitably comprises only three phases (FIG. 32) instead of four. The first and second phases (steps 3210 and 3212) are suitably similar to phases one and two of the dual-layer routing procedure described above. The third phase, however, comprises a modified process for generating candidate type-Z routes for unrouted nets. Initially, an unplotted net is selected for routing (step 3214). Routing system 10 then creates candidate type-Z routes for the net (step 3216). Unlike the dual-layer process, the process for generating type-Z routes for single layer routing suitably generates multiple type-Z routes for each selected net. A selected number of type-Z routes is generated for each of the remaining nets. When all of the nets have been processed for candidate type-Z routes (step 3218), routing system 10 builds a compatibility graph (step 3220) and reduces it (step 3222). Particular routes are then selected for each of the remaining nets (step 3224). If the iteration limit has not yet been reached (step 3226), the process is repeated for the remaining nets. If the iteration limit has been reached, the process is complete.

Figure 33:
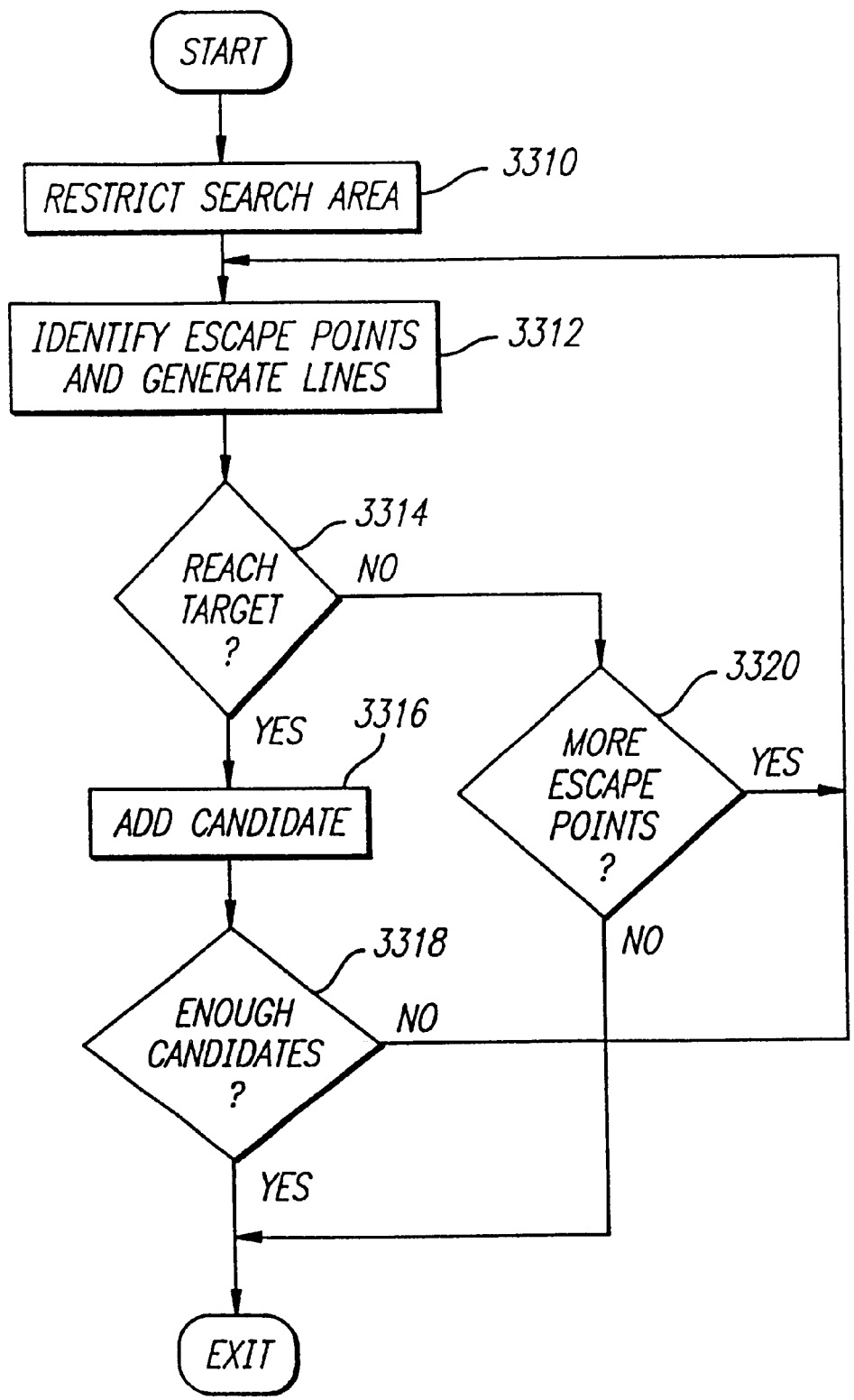
FIG. 33 is a flow diagram of a process for generating multiple Type Z routes in accordance with the process of FIG. 32.

The process for generating type-Z nets for a single-layer routing configuration suitably uses a modified line-probe technique. For single-layer routing, the process for searching out routes is similar, but because multiple candidates are suitably desirable, the process is not complete when an acceptable route is identified. Referring now to FIG. 33, the search area is suitably restricted (step 3310) to maintain efficiency, such as to an area slightly larger than the bounding box of the net. All of the available escape points for the selected net are identified (initially only the source), and perpendicular lines are extended from each escape point until the line encounters an obstacle (step 3312). Each of the resulting lines is analyzed to determine whether it encounters the target (step 3314). If so, the route is plotted for the net (step 3316). Routing system 10 then compares the total number of routes generated to the desired number of candidate routes (step 3318). If enough have been generated, the routine is complete and exits. If not, routing system 10 repeats the process to generate further candidate routes.

If the target has not been reached, routing system 10 determines whether further escape points are available (step 3320). If not, no further candidate routes are available, and the routine exits. If so, a new set of escape points is compiled based on the new line segments, and the process repeats until no new escape points are generated.

Summary

Routing system 10 avoids net ordering problems, and allows the designer to select the topology of the routes. Further, electrical considerations, such as crosstalk potential or timing constraints may be incorporated into compatibility analysis. Thus, the present routing system provides enhanced routing solutions by minimizing the number of layers, vias, and wire length, and improving overall density.

Closing

While the principles of the invention have now been made clear in illustrative embodiments, there will be immediately obvious to those skilled in the art many modifications of structure, arrangements, proportions, the elements, materials and components, used in the practice of the invention which are particularly adapted for a specific environment and operating requirements without departing from those principles.

What is claimed is:

1. A computer-implemented method of routing a plurality of nets between the terminals of a plurality of circuits, comprising the steps of:

generating a plurality of candidate routes for each of at least a first net and a second net;

analyzing each of said plurality of candidate routes corresponding to said first net for compatibility with each of said plurality of candidate routes corresponding to said second net;

discarding a first analyzed candidate route, wherein said discarded route is incompatible with at least one of the candidate routes corresponding to said second net;

wherein a second analyzed route is compatible with at least one of the candidate routes corresponding to a second net, further comprising the step of routing a corresponding net based on said compatible second analyzed candidate route; and inserting Steiner points into said routed corresponding net.

2. The method of claim 1, wherein said plurality of candidate routes is associated with a first layer pair of a substrate, further comprising the steps of:

determining whether each of the plurality of nets has an associated route which is compatible with all of a plurality of other routes associated with all of the other nets; and adding a second layer pair to said substrate if each of the plurality of nets does not have said associated route which is compatible with said set or routes associated with all of the other nets.

3. The method of claim 2, further comprising as the step of redistributing at least one routed net from said first layer pair to said second layer pair to reduce congestion on said first layer pair.

4. The method of claim 3, wherein said step of redistributing comprises the steps of:

generating at least one candidate route corresponding to said routed corresponding net on said second layer;

analyzing said routed corresponding net and said at least one candidate route for congestion on said first and second layer pairs, respectively; and moving said routed corresponding net to said second layer pair if said at least one candidate route is less congested than said routed corresponding net.

5. The method of claim 1, further comprising the step of removing jogs from said routed corresponding net.

6. The method of claim 1, further comprising the step of re-routing said routed corresponding net to reduce congestion.

7. The method of claim 1, wherein the plurality of nets includes at least one multi-terminal net having n number of terminals, wherein n is greater than two, further comprising the step of decomposing the at least one multi-terminal net into (n−1) number of two-terminal nets.

8. The method of claim 1, wherein said step of analyzing the candidate routes for compatibility includes analyzing the candidate routes for compatibility based on electrical interaction between the candidate routes.

9. The method of claim 1, wherein said step of generating said plurality of candidate routes includes generating only candidate routes having a first number of vias or fewer.

10. The method of claim 9, further comprising the step of, following the step of discarding said first analyzed candidate route, generating a second plurality of candidate routes for at least one of said first net and said second net, wherein the candidate routes have more than said first number of vias.

11. The method of claim 9, further comprising the step of discarding said first analyzed candidate route, generating a second plurality of candidate routes for at least one of said first net and said second net, wherein at least one of the candidate routes extends beyond the boundaries of a bounding box associated with the at least one net.

12. A computer-implemented method of routing a set of nets between a plurality of circuits having a plurality of terminals and mounted on a multi-layer substrate, comprising the steps of:

selecting a first set of compatible routes from a first set of candidate routes associated with a first layer pair, wherein each route of said first set of compatible routes has a first number of vias or less;

selecting a second set of compatible routes from a second set of candidate routes associated with said first layer pair, wherein each route of said second set of compatible routes has a second number of vias or less, said second number being greater than said first number, and said first and second sets of compatible routes are associated with different sets of nets, and said first and second sets of compatible routes are compatible with each other;

determining whether said first and second sets of compatible routes include a route corresponding to each of the nets;

following the step of determining, adding a second layer pair to the multi-layer substrate if said first and second sets of compatible routes do not include a route corresponding to each of the nets;

repeating said steps of selecting said first set of compatible routes and said second set of compatible routes in conjunction with said second layer pair instead of said first layer pair;

wherein the plurality of nets includes at least one multi-terminal net having n number of terminals, wherein n is greater than two, further comprising the step of decomposing the at least one multi-terminal net into (n−1) number of two-terminal nets; and inserting Steiner points into at least one route corresponding to a net.

13. The method of claim 12, further comprising the step of removing jogs from at least one route corresponding to a net.

14. The method of claim 12, further comprising the step of redistributing at least one route corresponding to a net from said second layer pair to reduce congestion on said first layer pair.

15. The method of claim 14, wherein said step of redistributing comprises the steps of:

generating at least one candidate route corresponding to said route corresponding to said net on said second layer;

analyzing said route corresponding to said net and said at least one candidate route for congestion on said first and second layer pairs, respectively; and moving said route corresponding to said net to said second layer pair if said at least one candidate route is less congested than said routed corresponding net.

16. The method of claim 12, further comprising the step of re-routing said routed corresponding net to reduce congestion.

* * * * *